(12) United States Patent
Ide et al.

(10) Patent No.: US 7,973,582 B2
(45) Date of Patent: Jul. 5, 2011

(54) TIMING CONTROL CIRCUIT AND SEMICONDUCTOR STORAGE DEVICE

(75) Inventors: Akira Ide, Tokyo (JP); Yasuhiro Takai, Tokyo (JP); Tomonori Sekiguchi, Tama (JP); Riichiro Takemura, Los Angeles, CA (US); Satoru Akiyama, Sagamihara (JP); Hiroaki Nakaya, Kokubunji (JP)

(73) Assignee: Elpida Memory, Inc., Tokyo (JP)

( * ) Notice: Subject to any disclaimer, the term of this patent is extended or adjusted under 35 U.S.C. 154(b) by 137 days.

(21) Appl. No.: 12/205,668

(22) Filed: Sep. 5, 2008

(65) Prior Publication Data
US 2009/0066390 A1  Mar. 12, 2009

(30) Foreign Application Priority Data

Sep. 7, 2007  (JP) .................................. 2007-233001

(51) Int. Cl.
*H03H 11/26* (2006.01)
(52) U.S. Cl. ........................................ 327/261; 327/281
(58) Field of Classification Search ........................ None
See application file for complete search history.

(56) References Cited

U.S. PATENT DOCUMENTS

| | | | | |
|---|---|---|---|---|
| 6,895,522 B2* | 5/2005 | Johnson et al. | ............... | 713/401 |
| 7,154,978 B2* | 12/2006 | Juan et al. | ............... | 375/376 |
| 7,218,158 B2* | 5/2007 | Kim | ............... | 327/158 |
| 7,688,123 B2* | 3/2010 | Oh | ............... | 327/158 |
| 2005/0193183 A1* | 9/2005 | Barth et al. | ............... | 711/170 |
| 2006/0145740 A1* | 7/2006 | Park et al. | ............... | 327/158 |
| 2008/0100356 A1* | 5/2008 | Lee | ............... | 327/158 |
| 2008/0191773 A1* | 8/2008 | Oh | ............... | 327/276 |
| 2010/0090735 A1* | 4/2010 | Cho | ............... | 327/158 |

FOREIGN PATENT DOCUMENTS

| JP | 2004110490 A | 4/2004 |
|---|---|---|
| JP | 2006186547 A | 7/2006 |

OTHER PUBLICATIONS

Kohtaroh Gotoh et al., "All-Digital Multi-Phase Delay Locked Loop for Internal Timing Generation in Embedded and/or High-Speed DRAMs", 1997 Symposium on VLSI Circuits Digest of Technical Papers, pp. 107-108.

* cited by examiner

*Primary Examiner* — Lincoln Donovan
*Assistant Examiner* — Sibin Chen
(74) *Attorney, Agent, or Firm* — Sughrue Mion, PLLC

(57) ABSTRACT

Disclosed is a timing control circuit which receives a first clock having a period T1 and a group of second clocks of L different phases (where L is a positive integer) spaced apart from each other at substantially equal intervals and which generates a fine timing signal delayed from the rising edge of the first clock by a delay td of approximately td=m·T1+n·(T2/L), where m and n are non-negative integers. The timing control circuit has a coarse delay circuit and a fine delay circuit. The coarse delay circuit counts the rising edges of the first clock after an activate signal is activated and generates a coarse timing signal delayed from the first clock by approximately m·T1. The fine delay circuit has a circuit which, after the activate signal is activated, detects a second clock, which has a rising edge that immediately follows the rising edge of the first clock, from among the group of L-phase second clocks. Using the edge-detection information, the fine delay circuit generates a fine timing signal for which the amount of delay from the coarse timing signal is approximately n·(T2/L). The values of m and n can be set by registers.

23 Claims, 21 Drawing Sheets

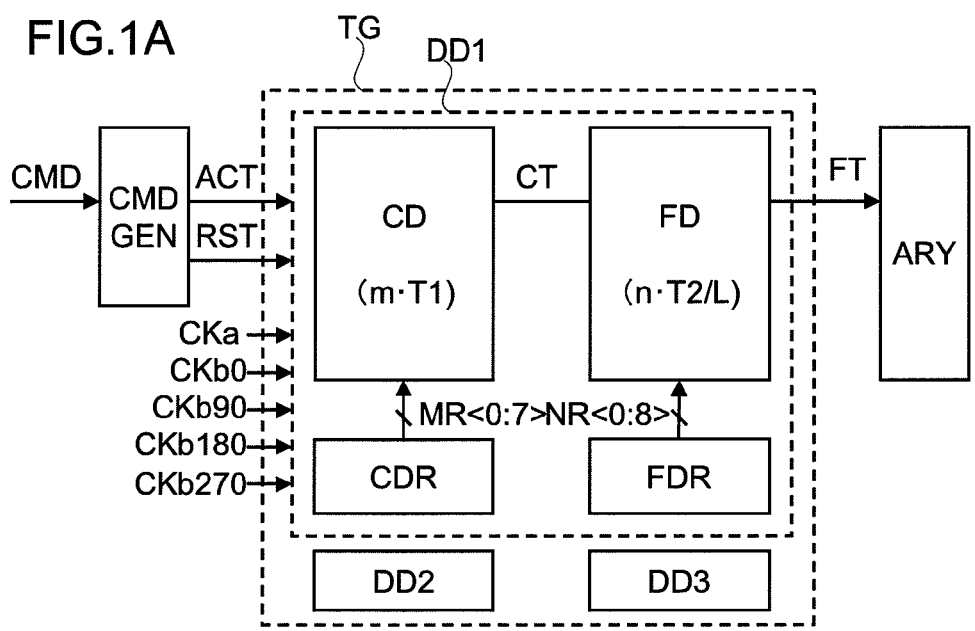
FIG.1A
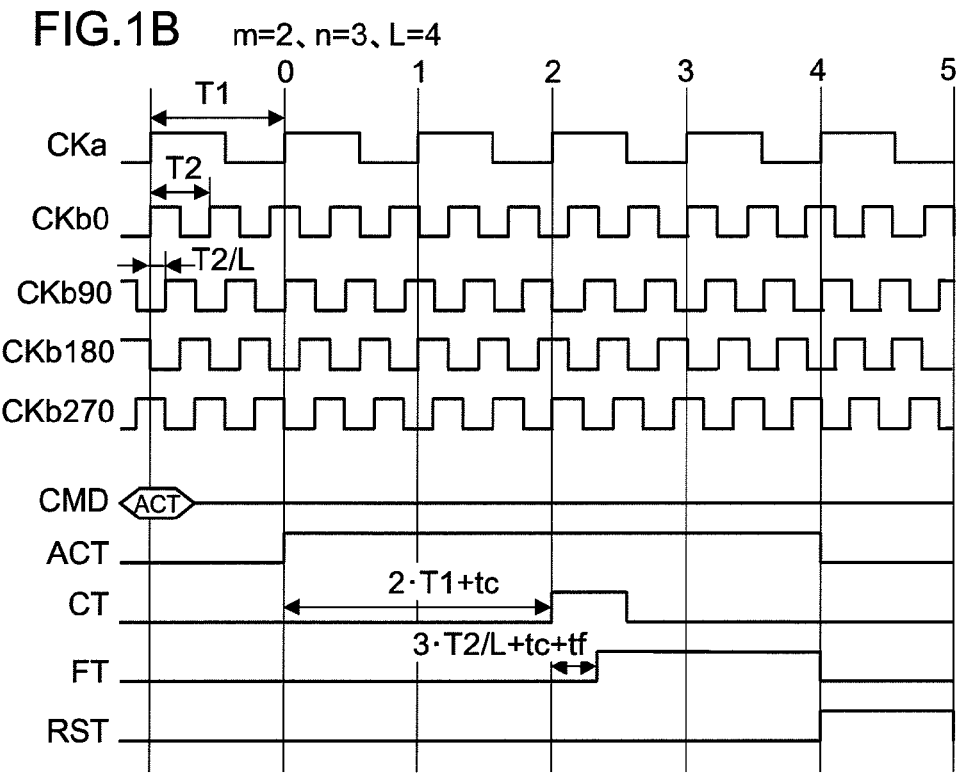
FIG.1B  m=2、n=3、L=4

FIG.21A  (Best)  RELATED ART
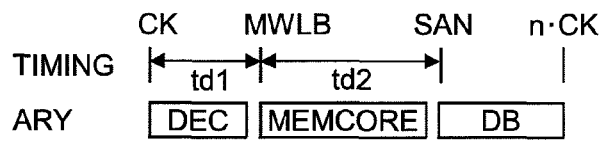
FIG.21B  (Worst)  RELATED ART
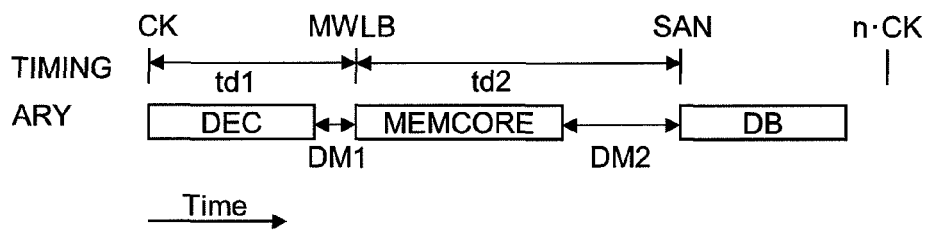

TIMING CONTROL CIRCUIT AND SEMICONDUCTOR STORAGE DEVICE

REFERENCE TO RELATED APPLICATION

This application is based upon and claims the benefit of the priority of Japanese patent application No. 2007-233001 filed on Sep. 7, 2007, the disclosure of which is incorporated herein in its entirety by reference thereto.

FIELD OF THE INVENTION

This invention relates to a timing control circuit. More particularly, the invention relates to a timing control circuit and method suited for timing signal generation in a semiconductor storage device and to a semiconductor storage device having this timing control circuit.

BACKGROUND OF THE INVENTION

FIG. 19A is a diagram schematically illustrating a typical configuration of a logic LSI chip. In order to raise the throughput of data processing in a logic LSI chip (LOGIC) in FIG. 19A, a pipeline operation is performed in which the path from a data input (DIN) to a data output (DOUT) is divided into a plurality of logic circuit blocks (LGK) at flip-flops (FF) and the flip-flops (FF1, FF2, and FF3) are controlled by a clock (CK). In the logic LSI chip (LOGIC), it is possible to perform the division in such a manner that each of the logic circuit blocks (LGK) will have substantially the same delay. As a result, operating frequency can be raised by performing a pipeline operation using flip-flops (FF1, FF2, and FF3) controlled by the common clock as set forth above. In the pipeline operation, a flip-flop (FF) samples the output of the immediately preceding logic circuit block (LGK) in synchronization with the clock and provides the sampled value to the succeeding logic circuit block (LGK), and the operation performed by each logic circuit block (LGK) is carried out in one clock cycle.

FIG. 19B is a diagram useful in describing a typical configuration of a clock-synchronized synchronous DRAM (SDRAM). For the sake of simplicity in FIG. 19B, input-stage flip-flops that sample respective ones of a command (CMD) and an address (ADD) are represented by FF1, and a command decoder and an address decoder are represented by a decoder (DEC). In the synchronous DRAM (SDRAM) shown in FIG. 19B, flip-flops FF1 and FF4 of input and output stages, respectively, of the command and address are controlled by clock CK (the rising edge of the clock). Other flip-flops (e.g., FF2, FF3) in the chip are controlled by timing signals produced in a timing control circuit (TG) by generating pulses in a pulse generator (PG) from the clock (CK) that has entered from an external terminal and delaying the pulses by analog delay circuits (ADLY1, ADLY2).

In the synchronous DRAM, the delays of the decoder (DEC), a memory array (MEMCORE) and a data bus (DB), which are functional blocks within the chip, differ greatly from one another. If timing is controlled by the common clock, the clock frequency at which operation is possible is decided by the delay of the memory array. That is, in the synchronous DRAM, the delays of the function blocks cannot be made approximately the same, pipeline operation cannot be carried out using flip-flops (FF) controlled by the common clock and, as a result, it is difficult to raise the frequency, as in the logic LSI of FIG. 19A.

The operation of the synchronous DRAM illustrated in FIG. 19B will be described taking a read operation as an example. When a command (CMD) and address (ADD) are supplied to the synchronous DRAM, each of these is captured into the chip in synchronization with the clock (CK) by the corresponding input-stage flip-flop FF1. The command and address that have been captured in the flip-flop FF1 are decoded by the decoder (DEC), and the operation (read in this case) and the address to be selected are decided. A clock pulse from the pulse generator (PG) is supplied to the clock terminal CK of the next flip-flop FF2 upon being delayed by the analog delay (ADLY1) so as to match with this timing, and a main word line (MWLB) of the selected address is activated in the memory array (MEMCORE).

Next, the pulse that has been delayed by the analog delay (ADLY1) is supplied to the clock terminal CK of the flip-flop FF3 upon being further delayed by the analog delay (ADLY2) so as to match with the timing at which a signal is generated on a bit line (not shown) from a memory cell (not shown) selected in the memory array (MEMCORE), a sense-amplifier start-up signal (SAN) is activated and the generated signal is amplified by a sense amplifier (not shown).

When a read command is input in succession, the signal that has been amplified by the sense amplifier (not shown) is transmitted up to an output buffer through a data bus (DB) and is output from the external data output terminal (DOUT) of the chip in synchronization with the clock from a counter (COUNT).

Patent Document 1 describes an arrangement having a coarse adjustment circuit for coarsely adjusting clock phase and a fine adjustment circuit for finely adjusting clock phase. It should be noted that the invention described in Patent Document 1 has an arrangement that is completely different from that of the present invention, described later. Further, Patent Document 2 discloses a timing generating circuit having first and second DLLs (Delay Locked Loops) for supplying supply voltage to serially connected coarse and fine delay units, wherein delay units used as monitor circuits of the first and second DLLs have the same circuit configurations as those of the coarse and fine delay units, respectively.

[Patent Document 1] Japanese Patent Kokai Publication No. JP-P2004-110490

[Patent Document 2] Japanese Patent Kokai Publication No. JP-P2006-186547

[Non-Patent Document 1] Kohtaroh Gotoh, Shigetoshi Wakayama, Miyoshi Saito, Junji Ogawa, Hirotaka Tamura, Yoshinori Okajima and Masao Taguchi, "All-Digital Multi-Phase Delay Locked Loop for Internal Timing Generation in Embedded and/or High-Speed DRAMs", 1997 Symposium on VLSI Circuits Digest of Technical Papers (pp. 107-108)

SUMMARY OF THE DISCLOSURE

The entire disclosures in the above-mentioned Non-Patent Document and Patent Documents are incorporated herein by reference. The analysis below is given by the present invention.

Owing to progress in the micro-fabrication of MOS transistors and interconnections in LSI chips and in the use of lower voltages, variations in device characteristics have become a major problem in recent years.

FIG. 20A is a diagram illustrating an example of the circuit configuration of the above-mentioned analog delay (ADLY). As one example, FIG. 20A illustrates an arrangement in which multiple stages of inverters (INV) are connected in cascade.

FIG. 20B illustrates values of a delay amount (td), which are exhibited by the analog delay (ADLY) of FIG. 20A, obtained by a simulation under various conditions, the values being illustrated as relative values. "Low voltage" corresponds to a case where the operating voltage has a low degree of variation, and "high voltage" corresponds to a case where the operating voltage has a high degree of variation. "Slow" corresponds to a case where the threshold value of a MOS transistor is high, and "fast" corresponds to a case where the threshold value of the MOS transistor is low. "High temp" corresponds to a case where the operating temperature is high, and "low temp" corresponds to a case where the operating temperature is low.

In FIG. 20B and by way of example, a combination of "low voltage", "slow" and "high temp" corresponds to a delay in a case where the following holds:
operating voltage exhibits a low degree of variation;
threshold value of the MOS transistor is high; and
operating temperature is high.
The delay amount (td) of the analog delay (ADLY) is large. Further, a combination of "high voltage", "fast" and "low temp" corresponds to a delay in a case where the following holds:
operating voltage exhibits a high degree of variation;
threshold value of the MOS transistor is low; and
operating temperature is low.
The delay amount (td) of the analog delay (ADLY) is small. Other combinations are read in similar fashion.

As will be understood from FIG. 20B, there is an approximate two-fold difference between a case where delay is longest (maximum delay) and a case where delay is shortest (minimum delay) in the analog delay (ADLY). When the amount of delay thus varies greatly in the delay circuit within the synchronous DRAM, access time increases.

FIG. 21A is a diagram schematically illustrating operation timings of circuit blocks under a condition ("Best") where the circuitry internally of a synchronous DRAM operates at its fastest. In FIG. 21A, the operating times of a decoder (DEC), memory array (MEMCORE) and data bus (DB) are taken along the horizontal axis.

A delay amount td1 from a clock (CK) to a main word line (MWLB) and a delay amount td2 from the main word line (MWLB) to a sense-amplifier startup signal (SAN) are decided in such a manner that the operating times of these circuit blocks will not overlap, and the timing control circuit (TG) is provided with analog delays (ADLY1, ADLY2), as illustrated in FIG. 19B. In this case, the delay amount of the analog delay (ADLY1) is made td1, and the delay amount of the analog delay (ADLY2) is made td2.

FIG. 21B illustrates operation timings under a condition ("Worst") where the circuitry operates at its slowest in a case where the circuitry has been designed upon deciding the delay amounts in the manner described above.

The operating times of the circuit blocks, namely the decoder (DEC), memory array (MEMCORE) and data bus (DB), have increased in comparison with the operating times of the circuit blocks shown in FIG. 21A and, in addition, the delay amounts of the analog delays (ADLY1, ADLY2) also have increased. Since the amounts of increase in the delay amounts (td1, td2) of the analog delays (ADLY1, ADLY2) are greater than the amounts of increase in the respective operating times of the decoder (DEC) and memory array (MEMCORE), dead margins (DM1, DM2) arise between the end of operation of the decider (DEC) and the start of operation of the memory array (MEMCORE) and between the end of operation of the memory array (MEMCORE) and the start of operation of the data bus (DB), respectively. Owing to these timing margins, access time becomes longer than the sum of the delay amounts of the circuit blocks, namely decoder (DEC), memory array (MEMCORE) and data bus (DB). As a consequence, a problem which arises is that the original performance of the device and circuits cannot be exploited.

On the other hand, if the delay amounts of the analog delays (ADLY1, ADLY2) of FIG. 19B are decided without providing timing margins under the worst condition illustrated in FIG. 19B, then, in the case of the best condition shown in FIG. 21A, a succeeding circuit block will start operating before the operation of the preceding circuit block ends [i.e., the delay amounts td1, td2 will be shorter than the operating times of the decoder (DEC) and memory array (MEMCORE)]. As a consequence, operation of one circuit block will overlap operation of another circuit block and malfunction will occur.

An example in which a digital delay element (circuit) is applied to a memory circuit in order to solve this problem has been reported. The digital delay element (circuit) generally refers to a circuit that uses a clock signal and multiphase clock and generates delays that are whole-number multiples of the periods of the clock signal and multiphase clock. If a digital delay element (circuit) is used, a delay decided by an externally supplied clock period can be generated even in a case where device, temperature and supply voltage vary. This is advantageous in that the amount of fluctuation in delay amount is small. As one example, Non-Patent Document 1 discloses a DRAM in which a multiphase clock is generated by a DLL (Delay Lock Loop) and the multiphase clock is used internally.

However, the DLL requires a prescribed length of time (e.g., on the order of 100 cycles) from supply of the clock until the delay within the DLL becomes synchronized to the clock. Consequently, the clock cannot be halted even in a standby mode in which the DRAM is not operating, and the problem that arises is an increase in current consumption in the standby mode.

In the present invention, there is provided a timing control circuit having a digital delay circuit, to which are input a first clock having a first period, a group of second clocks having a second period with phases spaced apart from each other at prescribed intervals, an activate signal and a selection signal for setting a delay amount, for outputting a timing signal delayed by a delay amount that is a combination of a delay time which is a prescribed multiple of the first period and a delay time which is a prescribed multiple of a length of time corresponding to the phase interval between adjacent clocks of the group of second clocks, with an effective edge of the first clock at the time when the activate signal is activated serving as a reference of the delay times, the delay times being decided by the selection signal.

In the present invention, if the first period is T1, the second period is T2, the group of second clocks are L-phase clocks for which the phase between adjacent clocks is T2/L (where L represents a prescribed positive integer), values decided by the selection signal are non-negative integers m and n, and td represents delay time from the effective edge of the first clock at the time when the activate signal is activated to an effective edge of the timing signal, then td is made a value obtained by adding delay amounts, which are independent of T1 and T2, to m·T1+n·(T2/L), which is the sum of a delay time m·T1, namely m times T1, and a delay time n·(T2/L), namely n times (T2/L).

In the present invention, the digital delay circuit includes a coarse delay circuit for outputting a coarse timing signal with a delay amount m·T1 from the effective edge of the first clock at the time when the activate signal is activated, where the first period is T1, the second period is T2, the group of second clocks are L-phase clocks for which the phase between adjacent clocks is T2/L (where L represents a prescribed positive integer) and values decided by the selection signal are non-negative integers m and n; and a fine delay circuit for deriving a second clock, which has an effective edge of a timing identical with that of an effective edge of the coarse timing signal, m cycles after the effective edge of the first clock at the timing when the activate signal is activated, based upon result of detection of a second clock having an effective edge at a timing simultaneous with or immediately following the effective edge of the first clock at the timing when the activate signal is activated, generating an L-phase fine clock group by rearranging the group of second clocks in such a manner that the derived second clock will become a first phase among L phases, and outputting a fine timing signal having a delay amount n·(T2/L), based upon the generated L-phase fine clock group.

In the present invention, it may be so arranged that the integers m, n are recorded in a register so as to be capable of being varied freely.

A timing control circuit according to the present invention comprises: a coarse delay circuit, to which are input a first clock having a first period (=T1), an activate signal and a selection signal (value=m) from a coarse-adjustment register, for outputting a coarse timing signal with a delay amount m·T1 from an effective edge of the first clock at the time when the activate signal is activated; and a fine delay circuit, to which are input a group of second clocks comprising L-number of clocks having a second period (=T2) with phases spaced apart from each other by T2/L (where L represents a prescribed integer equal to or greater than 2), the coarse timing signal that is output from the coarse delay circuit, the selection signal (value=m) from the coarse-adjustment register and a selection signal (value=n) from a fine-adjustment register, for deriving a second clock, which has an effective edge of a timing identical with that of an effective edge of the coarse timing signal in an mth cycle from the effective edge of the first clock, based upon result of detection of a second clock having an effective edge at a timing simultaneous with or immediately following the effective edge of the first clock at the timing when the activate signal is activated, generating an L-phase fine clock group by rearranging the group of second clocks in such a manner that the derived second clock will have a first phase among L phases, and outputting a fine timing signal having a delay amount n·(T2/L), based upon the generated L-phase fine clock group.

In the present invention, the coarse delay circuit includes: a shift register for transferring a fixed value successively in response to a shift clock that is input thereto; and a gate circuit, to which the first clock and the activate signal are input, for transmitting and outputting the first clock when the activate signal is in an activated state and masking the first clock when the activate signal is in a deactivated state; wherein a clock signal that is output from the gate circuit is used as a shift clock of the shift register. The coarse delay circuit further includes a plurality of switches provided in correspondence with the number of selection signals from the coarse-adjustment register and having input ends to which the clock from the gate circuit is input in common and output ends connected in common with a single node; wherein from among the plurality of switches, switches selected in correspondence with the value m of the selection signal from the coarse-adjustment register are turned on, based upon the output of the shift register, at the time when the fixed value has been shifted to an mth stage of the shift register, the mth stage corresponding to the selection signal; and m cycles (where m has been selected by the selection signal) after the effective edge of the first clock at the time when at which the activate signal is activated, the clock signal from the gate circuit is output to the node and the coarse timing signal is output.

In the present invention, it may be so arranged that the circuit has a circuit which, when the selection signal has been activated, is for setting a switch corresponding to the selection signal from the OFF to the ON state, based upon the output of the shift register, at the time when the fixed value has been shifted up to an mth stage of the shift register that corresponds to value m of the selection signal, and setting the switch from the ON to the OFF state at the time when the fixed value is shifted to an (m+1)th stage in the shift register, and when the selection signal is in a deactivated state, for turning the switch OFF.

In the present invention, it may be so arranged that the circuit has a buffer circuit for buffering the signal at the node to which the output ends of the plurality of switches are connected in common and outputting the coarse timing signal, wherein the buffer circuit has an inverting circuit to which the signal at the node is input, and a switch which, when the output of the inverting circuit is a first logic value, connects the node to a terminal having a potential corresponding to a second logic value. In the present invention, it may be so arranged that a clock that is the inverse of the clock that is output from the gate circuit is used as the shift clock in the shift register.

In the present invention, the fine delay circuit includes: an edge detecting circuit, to which the group of second clocks are input, for detecting a clock, which is from the group of second clocks, having an effective edge that transitions simultaneous with or immediately following the effective edge of the first clock, which is input when the activate signal is in the activated state; a phase selecting circuit, which receives a detection signal from the edge detecting circuit, for deriving a second clock, which has an effective edge of a timing identical with that of the effective edge of the coarse timing signal, in an mth cycle from the effective edge of the first clock at the timing when the activate signal is activated, based upon the selection signal (value m), generating a phase selection signal in such a manner that the derived second clock will have a first phase among L phases, and generating an L-phase fine clock group by rearranging the group of second clocks, based upon the phase selection signal; and a delay generating circuit for selecting, based upon the fine clock group, a signal corresponding to a delay that is a multiple n of (the second period)/L, from signals obtained by sampling the coarse timing signal at phases that differ every (second period)/L, and outputting the selected signal as the fine timing signal.

In the present invention, the edge detecting circuit of the fine delay circuit includes: a plurality of flip-flops for sampling the group of second clocks at the first clock, which is input when the activate signal is in the activated state; coincidence detecting circuits provided in correspondence with the plurality of flip-flops for detecting coincidence between outputs of adjacent flip-flops; and a gate circuit, which receives outputs from one of the coincidence detecting circuits and from an adjacent coincidence detecting circuit, for outputting an activated signal when the one coincidence detecting circuit indicates coincidence and the adjacent coincidence detecting circuit indicates non-coincidence.

In the present invention, the phase selecting circuit of the fine delay circuit includes: a phase calculating circuit, which receives a detection signal from the edge detecting circuit, for deriving a second clock, which has an effective edge of a timing identical with that of the effective edge of the coarse timing signal, in an mth cycle from the effective edge of the first clock at the timing when the activate signal is activated, based upon the selection signal (value m), and generating a phase selection signal in such a manner that the derived second clock will become a first phase among L phases; and first to Lth selectors for selecting clocks of first to Lth phases, based upon the phase selection signal, from the group of second clocks.

In the present invention, the delay generating circuit of the fine delay circuit includes: a flip-flop group, to which the coarse timing signal is input in common, for sampling the coarse timing signal at respective ones of the clocks of the fine clock group; and a selecting circuit for outputting, as the fine timing signal, the output of a flip-flop, which corresponds to a selection signal n from the fine-adjustment register, from among outputs of the flip-flop group.

In the present invention, the delay generating circuit of the fine delay circuit further includes: a separate flip-flop group, to which outputs from respective flip-flops of the first-mentioned flip-flop group are respectively input, for performing sampling at each clock of the fine clock group; wherein the selecting circuit outputs, as the fine timing signal, the output of a flip-flop corresponding to the selection signal n from the fine-adjustment register, from among outputs of the first-mentioned flip-flop group and separate flip-flop group.

In the present invention, inputs to one of the coincidence detecting circuits in the edge detecting circuit are an output signal from a corresponding flip-flop and an inverted signal obtained by inverting the output of an adjacent flip-flop.

In the present invention, the phase selecting circuit of the fine delay circuit is such that clocks of first to Lth phases of the group of second clocks are supplied to first inputs of respective ones of first to Lth selectors; clocks of second to Lth phases and of the first phase of the group of second clocks are supplied to second inputs of the first to Lth selectors; clocks of the Lth phase and of the first to (L−1)th phases of the group of second clocks are supplied to Lth inputs of the first to Lth selectors; and the first to Lth selectors select and output one of the first to Lth inputs based upon the phase selection signal.

In accordance with the present invention, there is provided a semiconductor storage device having the above-described timing control circuit for controlling timing internally of a chip. In the present invention, the semiconductor storage device is a DRAM, and timing generated by the timing control circuit is used for at least one among bit-line de-equalization, word-line activation, sense-amplifier activation, column-select line activation and main-amplifier activation.

In accordance with the present invention, a timing control circuit having a digital delay element capable of being started up in a short period of time can be provided.

In accordance with the present invention, a fluctuation in amount of delay of a generated timing signal can be reduced even if a process, supply voltage and temperature vary. In accordance with a semiconductor storage device having the timing control circuit of the present invention, dead margins can be eliminated. This makes it possible to shorten access time.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 1A and 1B are diagrams illustrating the configuration and operation waveforms, respectively, of a timing control circuit (TG) according to an embodiment of the present invention;

FIGS. 21A and 21B are diagrams illustrating best and worst, respectively, of operation timings of circuit blocks within a chip in a case where the conventional timing control scheme is used in a synchronous DRAM.

PREFERRED MODES OF THE INVENTION

Figure 2:
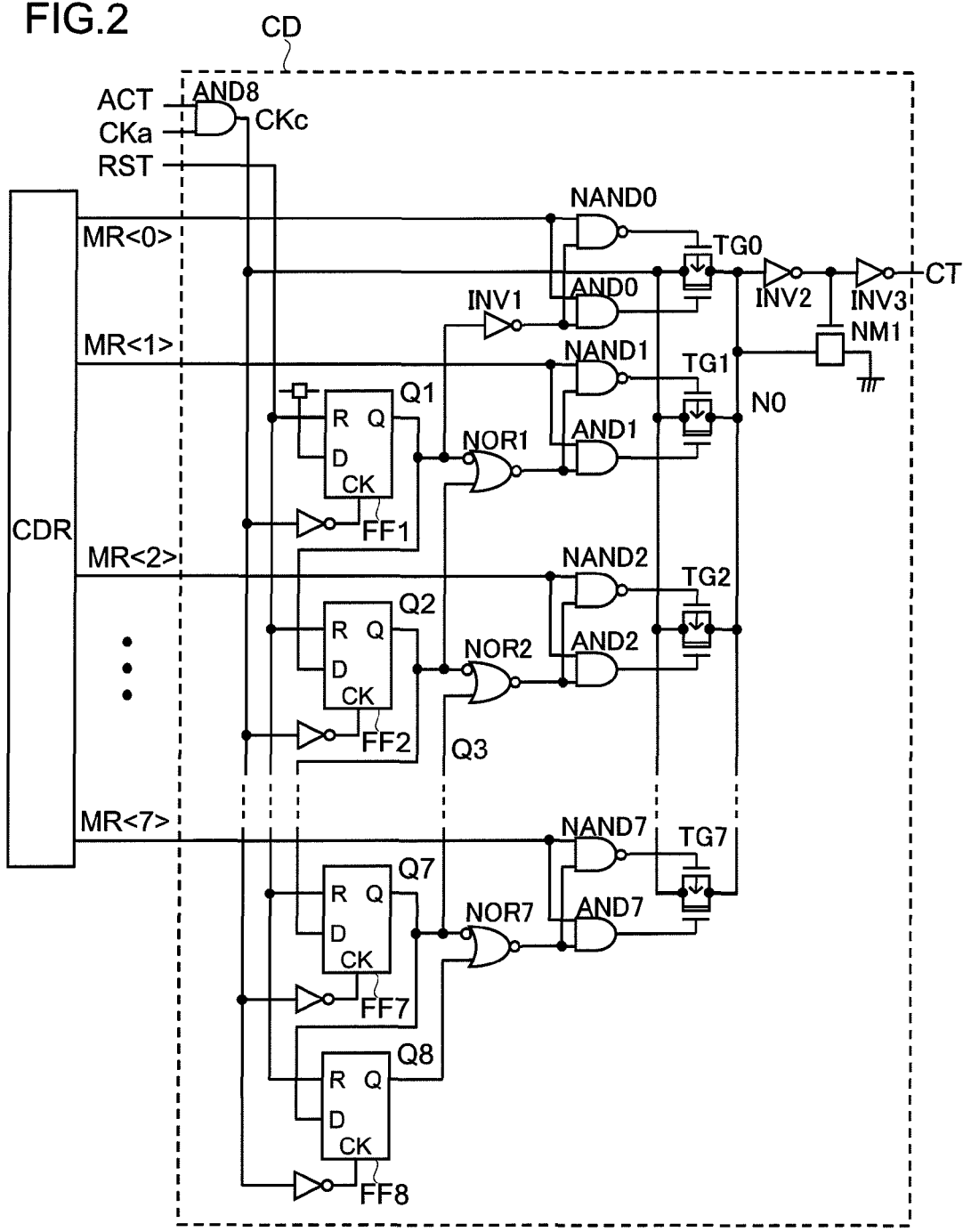
FIG. 2 is a diagram illustrating the circuit configuration of coarse delay circuit (CD) in the timing control circuit (TG) of FIG. 1A.

The modes of practicing the present invention will be described in detail with reference to the drawings. It should be noted that, in principle, identical members are identified by identical reference characters and will not be described repetitively in all of the drawings for describing the mode of the invention. Further, arrow symbols are appended to the gates of PMOS transistors in the drawings to distinguish these transistors from NMOS transistors. In addition, although the connections of substrate potentials of MOS transistors are shown, the method of connection is not particularly limited so long as the MOS transistors are capable of operating normally.

In the timing control circuit according to the present invention, the inputs are a first clock signal having a first period T1 and a group of second clocks having a second period T2 and constituting clocks of L phases (i.e., L-number of clock signals that differ in phase from each other by approximately T2/L). When values of a selection signal for selecting a delay are m, n (where m, n are non-negative integers), the timing control circuit generates a timing signal (a fine timing signal FT) such that an amount td of delay from the first clock will be approximately $td = m \cdot T1 + n \cdot (T2/L)$.

The timing control circuit according to the present invention includes a coarse delay circuit CD and a fine delay circuit FD. The coarse delay circuit CD has a counter for counting effective edges (e.g., rising edges) of the first clock signal after an activate signal ACT is activated. At the moment m clock cycles have been counted, the coarse delay circuit CD generates a coarse timing signal CT the amount of delay whereof from the effective edge of the first clock signal is approximately $m \cdot T1$.

From among the group of L-phase second clock signals, the fine delay circuit FD detects a second clock signal, which has an effective edge (e.g., a rising edge) immediately following an effective edge (e.g., a rising edge) of the first clock signal, after the activate signal ACT is activated, and, based upon the result of edge detection, generates a fine timing signal FT such that the amount of delay from the coarse timing signal CT will be approximately $n \cdot (T2/L)$.

More specifically, the fine delay circuit FD is such that if a second clock signal included among the group of L-phase second clock signals and having an effective edge immediately following the effective edge of the first clock signal is, e.g., the ith phase (where i is any value from 1 to L), then, based upon the result of edge detection, the second clock signal of the ith phase is adopted as the first-phase clock signal of an L-phase clock, the second clock signal of the (i+1)th phase (where the value returns to 1 if i+1 exceeds L) is adopted as the second-phase clock signal of the L-phase clock, and so on, with this temporal substitution being performed similarly thereafter to generate an L-phase clock. On the basis of the generated L-phase clock and n, the fine delay circuit FD generates the fine timing signal FT such that the amount of delay from the coarse timing signal CT will be approximately $n \cdot (T2/L)$. It should be noted that the values of m, n (both integers are greater than zero) of the selection signal that selects the delay are capable of being set by a register. Exemplary embodiments will now be described.

FIG. 1A is a diagram illustrating the configuration of the timing control circuit TG according to an exemplary embodiment of the present invention, and FIG. 1B is a diagram illustrating operation waveforms of the timing control circuit TG according to the embodiment.

With reference to FIG. 1A, the inputs to the timing control circuit TG of this exemplary embodiment are a clock A (CKa) (which corresponds to the first clock signal in the present invention) the clock period of which is T1, and clocks B (CKb) the period whereof is T2. The clocks B (CKb) are L-phase clock signals (which correspond to the group of second clock signals in the present invention) whose phases are spaced apart by 360°/L. The L-phase clock signals are such that their rising edges are equally spaced at a time difference of T2/L. Although there is no particular limitation, in this exemplary embodiment L is set to 4 and the clocks B (CKb) are made 4-phase clocks CKb0, CKb90, CKb180 and CKb270 whose phases are spaced apart from each other by 90°.

A command CMD is input to a command generator CMDGEN within a memory chip, and the activate signal ACT and a reset signal RST generated by the command generator CMDGEN are supplied to the timing control circuit TG.

The timing control circuit TG has a plurality of digital delay circuits DD1, DD2, DD3. Fine timing signals FT generated by respective ones of the plurality of digital delay circuits DD1, DD2, DD3 are supplied to memory arrays ARY. It should be noted that for the sake of simplicity, FIG. 1A illustrates an arrangement in which the fine timing signal FT generated by the digital delay circuit DD1 is input to the memory array ARY. Fine timing signals FT generated by the digital delay circuits DD2, DD3 and memory arrays ARY to which the fine timing signals FT generated by the respective digital delay circuits DD2, DD3 are input are not shown.

The fine timing signal FT has a rising edge delayed by the following delay time:

$$m \cdot T1 + n \cdot T2/L \quad (1)$$

from the rising edge (effective edge) of the clock A (CKa) when the activate signal ACT is active, with m, n being integers.

In the actual circuit, fixed delays (delays produced independently of the clock period) tc+tf of the portions through which the clock signal passes within the circuit are added on.

It should be noted that the effective edge of the clock A (CKa) is described in this exemplary embodiment as being the rising edge, although it goes without saying the invention is not limited to such an arrangement. For example, it is of course permissible to adopt an arrangement in which, e.g., the falling edge of the clock A (CKa) is adopted as the effective edge and the timing control signal generates a fine timing signal FT having a falling edge delayed by $m \cdot T1 + n \cdot T2/L$ from the falling edge of the clock A (CKa).

The digital delay circuits DD1, DD2, DD3 are identically constructed. In FIG. 1A, only the internal configuration of the digital delay circuit DD1 is illustrated.

As shown in FIG. 1A, the digital delay circuit DD1 includes the coarse delay circuit CD, the fine delay circuit FD, a coarse delay register CDR and a fine delay register FDR. It goes without saying that instead of providing the coarse delay register CDR and fine delay register FDR in each of the digital delay circuits DD1, DD2, DD3 individually, it may be so arranged that these are provided as a register group (register file) in common for the digital delay circuits DD1, DD2, DD3.

The clock A (CKa) is input to the coarse delay circuit CD. With the activate signal ACT in the activated state, the coarse delay circuit CD generates the coarse timing signal CT delayed from the rising edge of the clock A (CKa) by the following:

$$m \cdot T1 + tc \quad (2)$$

Here tc is a delay time specific to the coarse delay circuit CD. The value of m is transmitted to the coarse delay circuit CD from the coarse delay register CDR.

FIG. 1B illustrates a case where m=2 holds (MR<2> from the coarse delay register CDR of FIG. 1A is high). The coarse delay circuit CD outputs the coarse timing signal CT delayed by 2·T1+tc from the rising edge of clock A (CKa) in a state in which the activate signal ACT has been activated (namely from the start of cycle 0 in FIG. 1B).

The clocks B (CKb0, CKb90, CKb180 and CKb270) are supplied to the fine delay circuit FD, which proceeds to generate the fine timing signal FT delayed from the rising edge of the coarse timing signal CT by the following:

$$n \cdot T2/L + tf \quad (3)$$

where tf is a delay time specific to the fine delay circuit FD. The value of n is transmitted to the fine delay circuit FD from the fine delay register FDR. FIG. 1B illustrates a case where n=3 holds (NR<3> from the fine delay register FDR of FIG. 1A is high).

The delay time td from the rising edge of clock A (CKa) to the rising edge of the fine timing signal FT in the state in which the activate signal ACT has been activated is represented by the following:

$$td = 2 \cdot T1 + 3 \cdot T2/L + tc + tf \quad (4)$$

In view of Equation (4), the delay time td increases by T1 whenever the value of m is incremented by one and increases by T2/L whenever the value of n is incremented by one.

When the timing control circuit of this exemplary embodiment is used, the fine timing signal FT is decided by T1, T2, L, m and n, and therefore a characterizing feature is that the circuit is not readily susceptible to fluctuations ascribable to temperature changes or variations in supply voltage and differences among devices. Only the fixed delay tc+tf, which is small in comparison with the overall delay, is influenced by temperature changes or variations in supply voltage and differences among devices. This means that the proportion of the amount of fluctuation in delay with respect to the overall delay can be greatly reduced.

FIG. 2 is a diagram illustrating an example of the circuit configuration of the coarse delay circuit CD in FIG. 1. As shown in FIG. 2, the coarse delay circuit CD has a shift register (which functions as a counter for counting the clock) comprising a plurality of cascade-connected flip-flops (FF1 to FF8). By selecting a CMOS transfer gate (TG0, TG1, . . . , TG7), which is turned on, based upon an m-selection signal MR<0:7> from the coarse delay register CDR and the output of the applicable stage of the shift register, the coarse delay circuit CD generates the coarse timing signal CT that is the result of delaying the clock A (CKa) by m cycles.

An AND gate AND8 receives the activate signal ACT and clock CKa as inputs, transmits the clock CKa and outputs it as a clock CKc when the activate signal ACT is in the activated state (high), and outputs a fixed value (low) (masks the clock) when the activate signal ACT is in the deactivated state (low).

The plurality of transfer gates (TG0, TG1, . . . , TG7) receive the clock CKa as a common input and have their outputs connected in common with a node N0. The node N0 is connected to CT via an inverter INV2 and an inverter (inverting buffer) INV3.

With regard to control of transfer gate TG0 corresponding to the activated MR<0> in the m-selection signal, the gate is turned on selectively and outputs CKc as the coarse timing signal CT when output Q1 of flip-flop FF1 in the next stage is low. When output Q1 of flip-flop FF1 goes high in the next clock cycle, gate TG0 is turned off and, as a result, outputs a one-shot pulse as the coarse timing signal CT.

Further, with regard to control of transfer gate TGi corresponding to the activated MR<i> (where i is 1 to 7) in the m-selection signal, the gate is turned on selectively and outputs CKc as the coarse timing signal CT when output Qi of the flip-flop FFi of the corresponding stage is high and, moreover, output Qi+1 of flip-flop FFi+1 of the next stage is low. When output Qi of flip-flop FFi of the corresponding stage goes high and, moreover, output Qi+1 of flip-flop FFi+1 of the next stage goes high in the next clock cycle, gate TGi is turned off and, as a result, outputs a one-shot pulse as the coarse timing signal CT. It should be noted that an NMOS transistor NM1 having a gate that receives the output of the inverter INV2, a source connected to ground and a drain connected to the node N0 is turned on when the output of the inverter INV2 is high, thereby discharging the node N0 and establishing ground potential at the node.

More specifically, the output of NAND gate NAND0 to which are input MR<0> in the m-selection signal MR<0:7> and the output of the inverter INV1 that inverts the output Q1 of flip-flop FF1, and the output of AND gate AND0 to which are input the output of inverter INV1 and MR<0>, are connected to gates of the PMOS transistor and NMOS transistor, respectively, of transfer gate TG0. If, when the activate signal ACT and MR<0> are in the activated state (high), the output Q1 of flip-flop FF1 is low, then the outputs of NAND0 and AND0 go low and high, respectively, and gate TG0 turns on. If, when the activate signal ACT and MR<0> are in the activated state (high), the output Q1 of flip-flop FF1 goes high, then the outputs of NAND0 and AND0 go high and low, respectively, and gate TG0 turns off. That is, at cycle 0 (the falling edge of clock CKc is pulse zero), which is the moment the activate signal ACT is activated, transfer gate TG0 turns on, clock CKc is output to node N0 and is output to CT via the buffers (INV2, INV3).

A data input terminal D of the first flip-flop FF1 is connected to a power supply VDD, a signal that is the result of inverting clock CKc by an inverter is input to a clock terminal CK of the flip-flop FF1, and output Q1 of the flip-flop FF1 is connected to a data input terminal D of flip-flop FF2 of the next stage and is applied to an inverting input (negative-logic input) of a NOR gate NOR1. [Accordingly, an inverting output terminal Q1B (not shown) of flip-flop FF1 may be connected to this input of NOR gate NOR1]. Output Q1 of flip-flop FF1 is input to AND gate AND0 via inverter INV1, as mentioned above. Output Q2 of flip-flop FF2 of the next stage is input to the other input of NOR gate NOR1, and the output of NOR gate NOR1 is input to AND gate AND1. Accordingly, NOR gate NOR1 outputs the high level when output Q1 of flip-flop FF1 is high and output Q2 of flip-flop FF2 is low, and outputs the low level otherwise. The output of NAND gate NAND1 to which MR<1> and the output of NOR gate NOR1 are input and the output of AND gate AND1 to which the output of NOR gate NOR1 and MR<1> are input are connected to the gates of the PMOS transistor and NMOS transistor of transfer gate TG1.

If, as a result of flip-flop FF1 sampling the power-supply potential at the falling edge of clock CKc when the activate signal ACT and MR<1> are in the activated state (high), the output Q1 is high and the output Q2 of flip-flop FF2 is low (a state in which the power-supply potential has not been shifted as far as flip-flop FF2), then the output of NOR gate NOR1 goes high, the outputs of NAND gate NAND1 and AND gate AND1 go low and high, respectively, and transfer gate TG1 turns on. If, when the activate signal ACT and MR<1> are in the activated state (high), output Q1 of flip-flop FF1 and output Q2 of flip-flop FF2 both go high (i.e., if the power-supply potential is shifted as far as flip-flop FF2), then the output of NOR gate NOR1 goes low at this time, the outputs of NAND gate NAND1 and AND gate AND1 go high and low, respectively, and transfer gate TG1 turns off. That is, from the moment the activate signal ACT is activated, the transfer gate TG1 turns on in response to the falling edge of the first pulse of clock CKc, clock CKc is output to node N0 and is output to CT via the buffers (INV2, INV3). When transfer gate TG1 turns on, node N0 is discharged to the ground terminal via NMOS transistor NM1 in response to clock CKa transitioning from high to low. The transfer gate TG1 then turns off in response to the falling edge of the second pulse of clock CKc.

A similar arrangement holds for the flip-flops FF2 to FF7 of the succeeding stages. It should be noted that the output of flip-flop FF8 is input to NOR gate NOR7, which corresponds to the flip-flop FF7 of the preceding stage. The flip-flops FF1 to FF8 have the reset signal RST connected in common with their reset terminals (R). When the reset signal RST is high, the output terminals Q1 to Q8 of these flip-flops are reset to the low level. The flip-flop FF1 samples and outputs the high potential (power-supply potential) in response to the falling edge of the first pulse of clock CKc. The flip-flops FF2 to FF7 sample and output the high potential that is output from the flip-flops FF1 to FF6 of the preceding stages in response to the falling edges of the second to seventh pulses, respectively, of clock CKc. The flip-flop FF8 samples and outputs the high potential that is output from the flip-flop FF7 in response to the falling edge of the seventh pulse of clock CKc.

Figure 3:
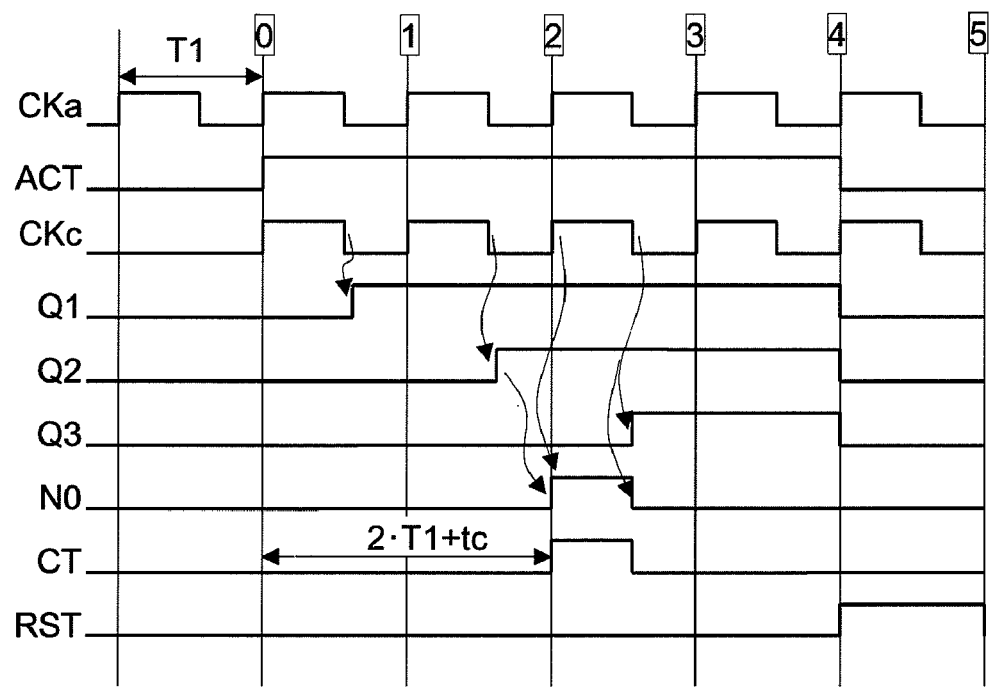
FIG. 3 is a diagram illustrating the operation waveforms of the coarse delay circuit (CD) in FIG. 2.

FIG. 3 is a timing chart useful in describing operation of the coarse delay circuit CD of FIG. 2. The result of taking the AND between clock A (CKa) and the activate signal ACT (using AND gate AND8 in FIG. 2) is clock CKc, and clock CKc is input as a shift clock to the shift register comprising the flip-flops FF1 to FF8. Since a signal obtained by inverting clock CKc is input to the clock terminals of the shift register, the high potential is transferred one clock cycle at a time to Q1 to Q7 at the falling edges of the signal. In FIG. 3, Q1 to Q4 attain the high potential successively in response to the falling edges of clock CKc in clock cycles 0 to 3 subsequent to the activate signal ACT going high, the reset signal RST is set to the high level and outputs Q1 to Q8 of flip-flops FF1 to FF8 are reset to the low level in clock cycle 4.

After the activate signal ACT is activated, output terminal Q2 of flip-flop FF2 transitions from low to high at the falling edge (the second falling edge) of clock CKc in clock cycle 1. In the case where m=2 holds, MR<2> is made high and the transfer gate TG2 is rendered conductive through the selector (AND2, NAND2, NOR2). That is, when MR<2> is high, output Q2 of flip-flop FF2 is high and output Q3 of flip-flop FF3 is low, the output of NOR gate NOR2 goes high, the output of NAND gate NAND2 goes low, the output of AND gate AND2 goes high and both the PMOS transistor and NMOS transistor of transfer gate TG2 are turned on. Under these conditions, the second rising edge of clock CKc passes through transfer gate TG2 and the delay of 2·T1+tc is generated at node N0.

After the activate signal ACT is activated, output terminal Q2 of flip-flop FF2 is high and output Q3 of flip-flop FF3 goes high at the subsequent falling edge (the third falling edge) of clock CKc in clock cycle 2. Therefore, the output of NOR gate NOR2 goes low, the output of NAND gate NAND2 goes high, the output of AND gate AND2 goes low and both the PMOS transistor and NMOS transistor of transfer gate TG2 are turned off and rendered non-conductive.

In clock cycle 2, the pulse of clock CKc transmitted to node N0 is output as coarse timing signal CT via inverters INV2, INV3. When clock CKc transmitted to node N0 transitions from high to low, the output of inverter INV2 goes high, pass transistor NM1 turns on, the charge at node N0 is discharged and node N0 falls to the low potential.

As a result, the coarse timing signal CT is capable of being generated as a one-shot pulse having the delay m·T1+tc decided by m (MR<0> to <7>) from the coarse delay register CDR. Here tc is an amount of delay that arises owing to passage of the clock pulse CKa through the interior of the coarse delay circuit CD. For example, tc corresponds to the sum of propagation delay times of AND gate AND8, a transfer gate and inverters INV2, INV3.

The coarse delay circuit CD according to this exemplary embodiment is capable of generating a delay exhibiting small fluctuation with respect to variations in temperature and process.

Further, the coarse delay circuit CD does not output the shift-register output per se as coarse timing and places the transfer gate through which the clock CKc passes in the conductive state (on state) beforehand at the falling edge of the clock CKc in the previous clock cycle. As a result, the path traversed by the clock is shortened and time difference between the output and the clock edge can be reduced. For example, when MR<2> is high in FIG. 3, output Q2 of flip-flop FF2 rises to the high level at the falling edge of clock CKc in clock cycle 1, the transfer gate TG2 is rendered conductive (turned on) in response, and the high-level pulse of clock CKc in clock cycle 2 is transmitted to node N0 via transfer gate TG2. The path traversed by clock CKc until it is output to node N0 is only the conductive transfer gate TG2 and the time difference between the output and the edge of clock CKc is reduced. Accordingly, the influence of fluctuations in delay time, which are ascribable to variations in process, voltage and temperature, on the coarse timing signal CT are suppressed.

Figure 4:
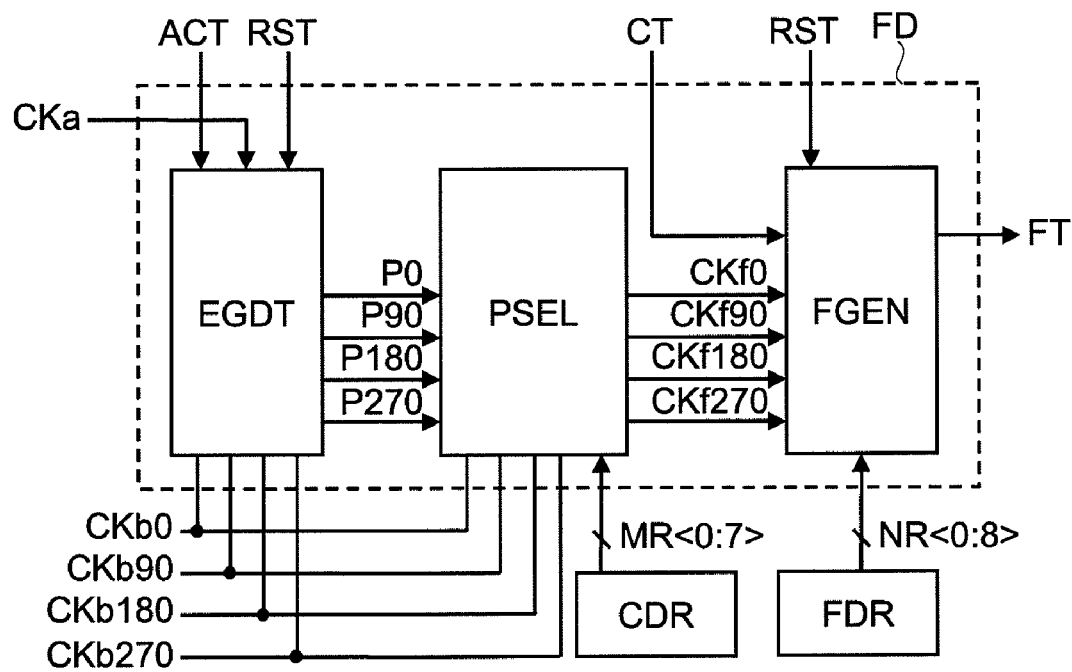
FIG. 4 is a diagram illustrating the configuration of a fine delay circuit (FD) IN THE timing control circuit (TG) of FIG. 1A.

FIG. 4 is a diagram illustrating the configuration of the fine delay circuit FD of FIG. 1A. As shown in FIG. 4, the fine delay circuit FD has an edge-detection-type arrangement and includes an edge detecting circuit EGDT, a phase selecting circuit PSEL and a delay generating circuit FGEN.

The activate signal ACT, clock A (CKa) and clock B (CKb0, CKb90, CKb180, CKb270) are supplied to the edge detecting circuit EGDT. The edge detecting circuit EGDT detects a clock among clocks B (CKb0, CKb90, CKb180, CKb270) that rises simultaneous with or immediately following a rising edge of clock A (CKa) at the timing at which the activate signal ACT is activated (the timing of the transition from low to high), and outputs the result of detection.

Figure 6:
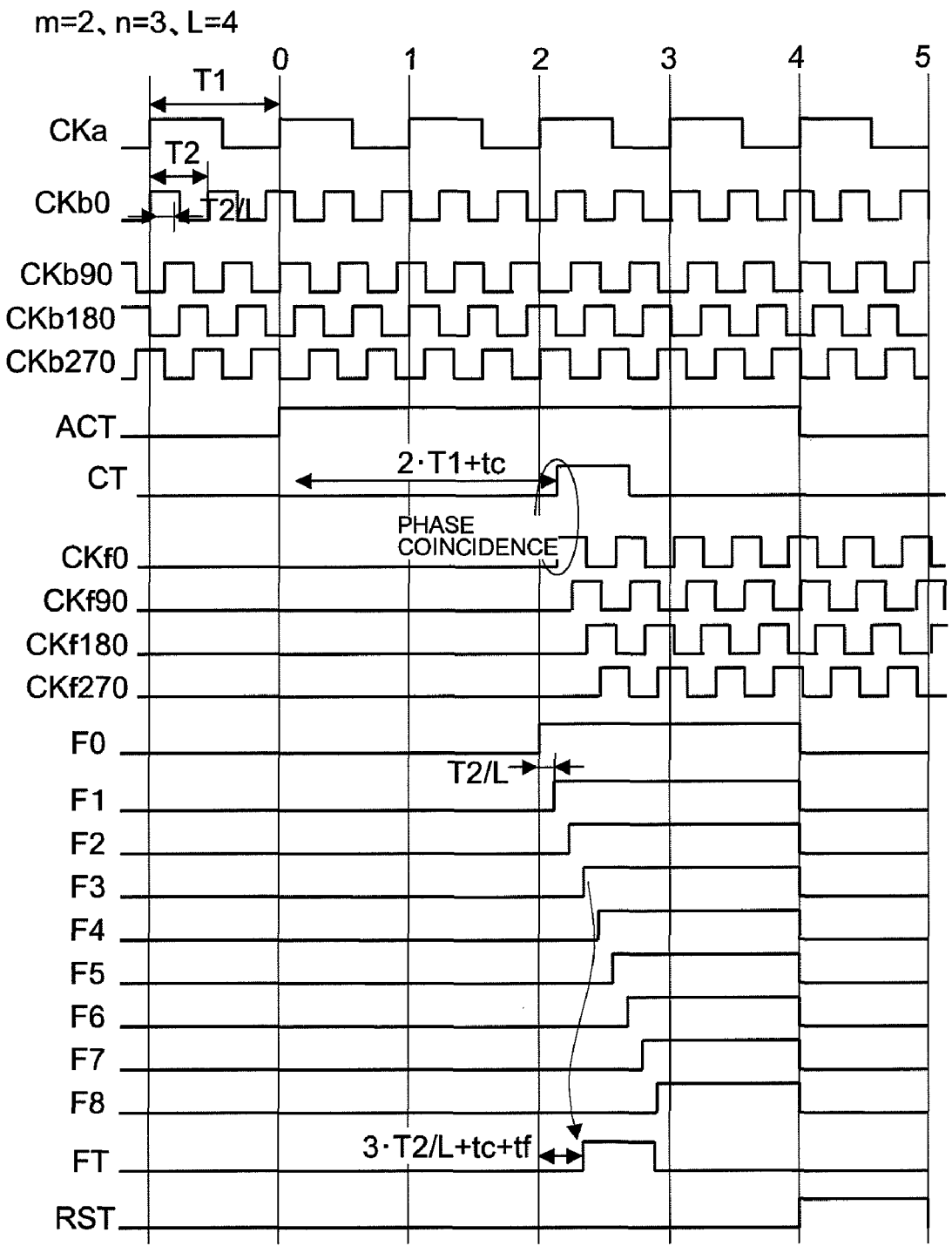
FIG. 6 is a diagram illustrating the operation waveforms of the delay generating circuit in FIG. 5.

FIG. 6 is a diagram illustrating operation waveforms of the fine delay circuit FD. In FIG. 6, a clock that is rising simultaneous with a $0^{th}$ (clock cycle 0) rising edge of clock A (CKa) at the timing at which activate signal ACT is activated is the second (second-phase) CKb90 among clocks B (CKb0, CKb90, CKb180, CKb270).

The edge detecting circuit EGDT outputs the result of edge detection as edge-detection result signals P0, P90, P180, P270. The edge detecting circuit EGDT activates the signal P90 (places it at the high level) in a case where the clock rising simultaneous with the rising edge of clock A (CKa) at the timing at which activate signal ACT is activated is CKb90.

The frequency of clock A (CKa) and the frequency of clocks B differ from each other. Therefore, even though CKb90 rises at the same timing as (in phase with) the $0^{th}$ rising edge of clock A (CKa), the clock B having the rising edge in the mth cycle of clock A (CKa) will differ depending upon the value of m (this holds true not only for CKb90). In the example shown in FIG. 6, the clock B that rises at the rising edge in cycle 2 of clock A (CKa) after the activate signal ACT is activated is CKb270 and not CKb90.

The following are supplied to the phase selecting circuit PSEL of FIG. 4:

the edge-detection result signals P0, P90, P180, P270 from the edge detecting circuit EGDT;

the clock A (CKa);
the clocks B (CKb0, CKb90, CKb180, CKb270); and
the m-selection signal MR<0:7> from the coarse delay register CDR.

From among the clocks B (CKb0, CKb90, CKb180, CKb270), the phase selecting circuit PSEL derives a clock whose rising edge coincides with the timing of the rising edge of clock A (CKa) after m cycles of clock Cka following activation of the activate signal ACT, and outputs results as a 4-phase clock (CKf0, CKf90, CKf180, CKf270) for fine adjustment.

Among these, CKf0 rises at a timing identical with that of the rising edge of the coarse timing signal CT after m cycles of clock CKa following activation of the activate signal ACT, and CKf0, CKf90, CKf180, CKf270 are output as clocks of period T2 shifted in phase from each other by 90°.

The following are supplied to the delay generating circuit FGEN:
the value of n (n is an integer) that is output from the fine delay register FDR as the n-selection signal NR<0:8>; and
the fine adjustment clocks CKf0, CKf90, CKf180, CKf270.

The delay generating circuit FGEN generates the delay n·T2/L+tf and adds this to the coarse timing signal CT to thereby generate the fine timing signal FT. Here tf is a delay specific to the delay generating circuit FGEN and is the amount of delay from CT to FT in a case where NR<0> is high.

Figure 5:
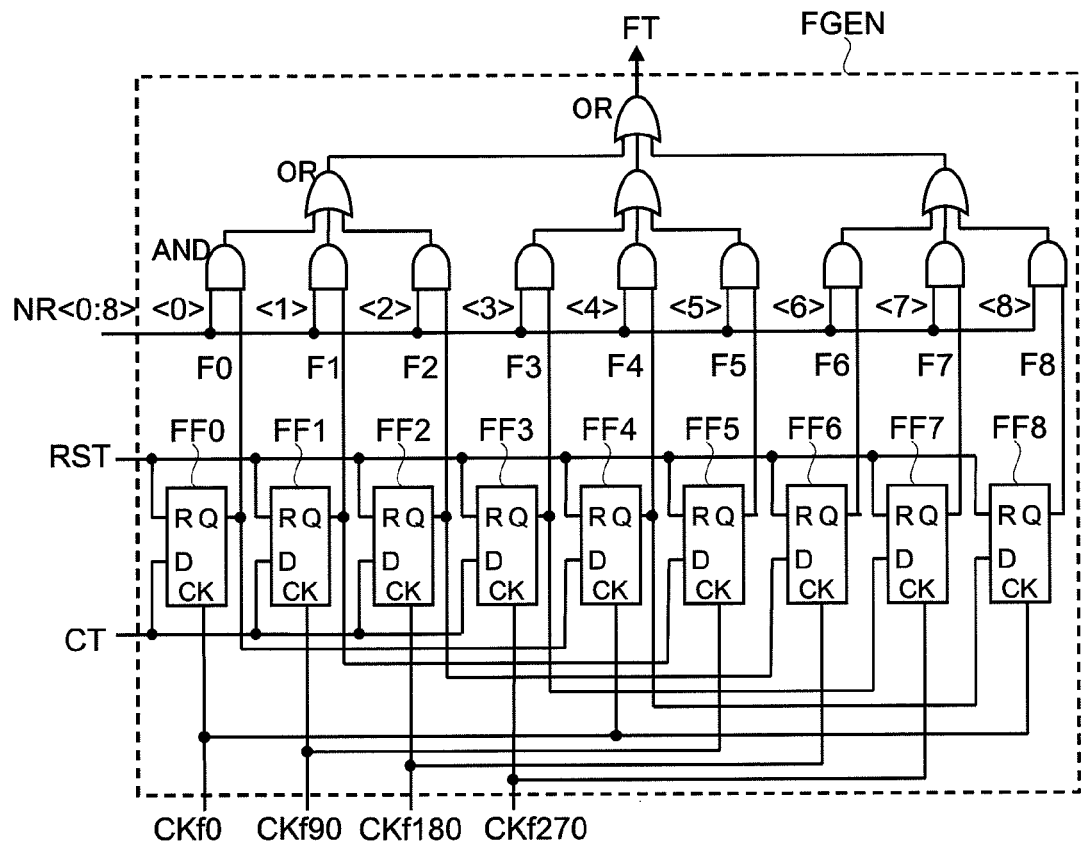
FIG. 5 is a diagram illustrating the circuit configuration of a delay generating circuit in the fine delay circuit (FD) of FIG. 4.

FIG. 5 is a diagram illustrating the circuit configuration of the delay generating circuit FGEN in FIG. 4. As shown in FIG. 5, the delay generating circuit FGEN comprises flip-flops (FF0 to FF3, FF4 to FF7, and FF8) to the clock terminals CK of which the fine clocks CKf0, CKf90, CKf180, CKf270, CKf0, CKf90, CKf180, CKf270, and CKf0 are respectively applied; and a selector for receiving the n-selection signal NR<0:8> as an input and selecting and output of the flip-flops (FF0 to FF2, FF3 to FF5, and FF6 to FF8). The selector has three 2-input AND gates the respective inputs to which are an output node F0 of flip-flop FF0 and NR<0>, an output node F1 of flip-flop FF1 and NR<1>, and an output node F2 of flip-flop FF2 and NR<2>; and a 3-input OR gate the inputs to which are the outputs from the three 2-input AND gates. These three AND gates and the OR gate form one set, and a similar set is provided for flip-flops FF3 to FF5 and for flip-flops FF6 to FF8. The outputs of the three OR gates are supplied to a 3-input OR gate, the output of which is the fine timing signal FT.

The flip-flops FF0 to FF3 have respective data input terminals D to which the coarse timing signal CT is applied in common and clock terminals CK to which the fine clocks CKf0, CKf90, CKf180, CKf270, respectively, are applied, and generate $0^{th}$ to $3^{rd}$ fine timings, respectively. The flip-flops FF4 to FF8 have respective data input terminals D to which output terminals Q of the flip-flops FF0 to FF4, respectively, are connected, clock terminals CK to which the fine clocks CKf0, CKf90, CKf180, CKf270, and CKf0 respectively, are applied, and generate $4^{th}$ to $8^{th}$ fine timings, respectively. When NR<i> (i is 0 to 8) is high, output Fi of flip-flop FFi is output as the fine timing signal FT.

FIG. 6 illustrates the operation waveforms of the delay generating circuit FGEN shown in FIG. 5. When the coarse timing signal CT is input to the flip-flops two cycles after the activate signal ACT is activated, namely in clock cycle 2, the signals at the nodes F0, F1, F2, ... F8 in FIG. 5 rise one after another at equal intervals T2/L in response to the rising edges of the fine clocks CKf0, CKf90, CKf180, CKf270. As to which among F0, F1, F2, ... F8 will be selected as the fine timing, this is decided using the n-selection signal NR<0:8>. When NR<i> (i is 0 to 8) is high, Fi is output as the fine timing signal FT via the AND and OR gates. In FIG. 6, an example in which NR<3> has been activated (raised to the high level) is illustrated, and the fine timing signal FT delayed by 3·T2/L from the coarse timing signal CT is output.

Figure 7:
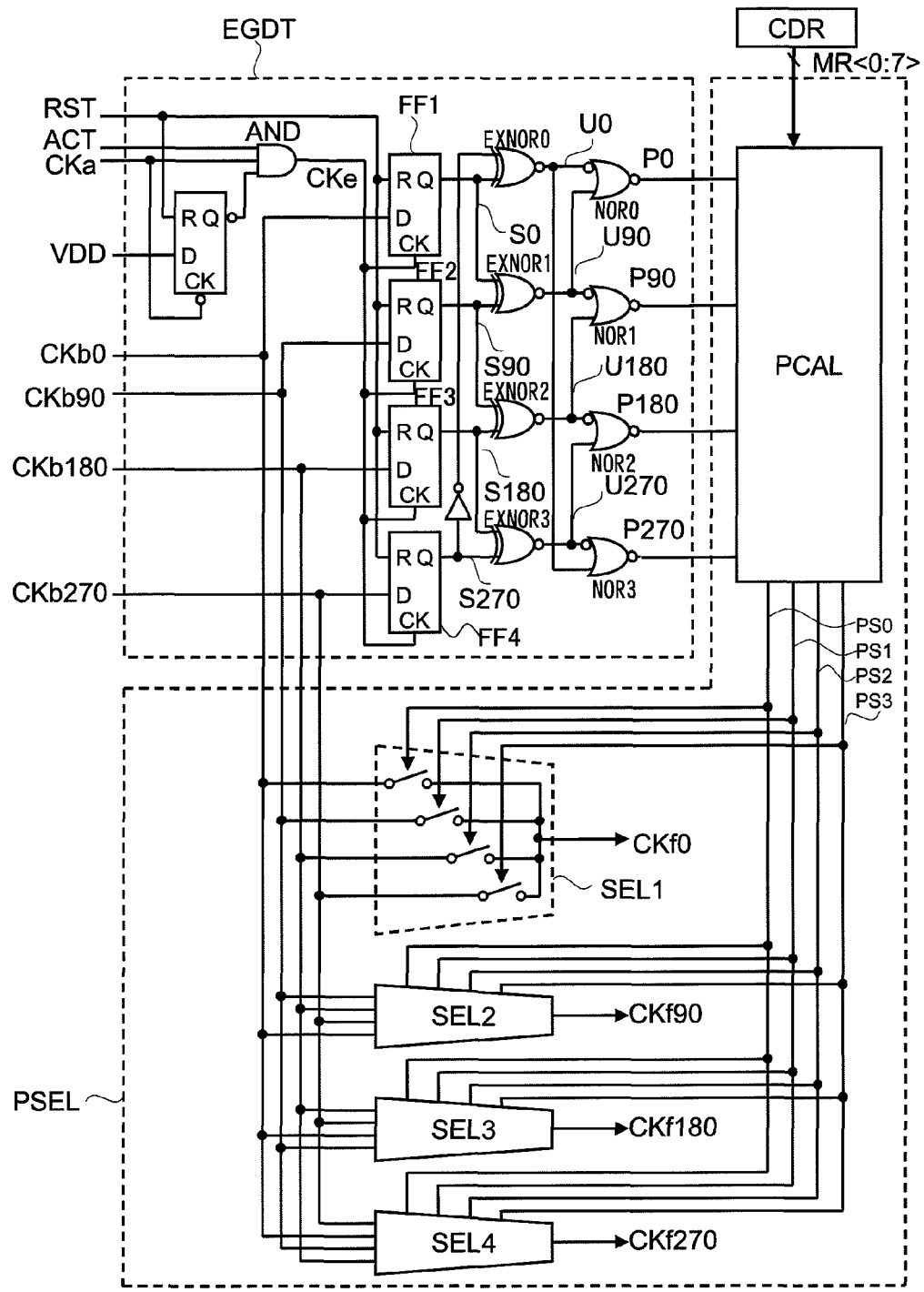
FIG. 7 is a diagram illustrating the circuit configurations of an edge detecting circuit (EGDT) and phase selecting circuit in the fine delay circuit (FD) of FIG. 4.

FIG. 7 is a diagram illustrating the circuit configurations of the edge detecting circuit EGDT and phase selecting circuit PSEL. An AND gate AND receives the activate signal ACT and clock A (CKa) as inputs, outputs CKa as Cke when the activate signal ACT is high and outputs a fixed value (low) when the activate signal ACT is low.

An edge of clocks B (CKb0, CKb90, CKb180, CKb270) that rises simultaneous with or immediately following the rising edge of CKe is detected by flip-flops FF1 to FF4, and edge-detection result signals P0, P90, P180, P270 corresponding to the clocks B (CKb0, CKb90, CKb180, CKb270), respectively, are output.

Output S0 of flip-flop FF1 and a signal obtained by inverting output S270 of flip-flop FF4 are supplied to an exclusive-NOR gate EXNOR1, which constitutes a coincidence detection circuit. Output S90 of flip-flop FF2 and output S0 of flip-flop FF1 are supplied to an exclusive-NOR gate EXNOR2, output S180 of flip-flop FF3 and output S90 of flip-flop FF2 are supplied to an exclusive-NOR gate EXNOR3, and output S270 of flip-flop FF4 and output S180 of flip-flop FF3 are supplied to an exclusive-NOR gate EXNOR4.

The edge detecting circuit EGDT includes a NOR gate NOR0 that takes the NOR between the inverse of output U0 of exclusive-NOR gate EXNOR0 and output U90 of exclusive-NOR gate EXNOR1 (the NOR is high when output U0 is high and output U90 is low); a NOR gate NOR1 that takes the NOR between the inverse of output U90 of exclusive-NOR gate EXNOR1 and output U180 of exclusive-NOR gate EXNOR2 (the NOR is high when output U90 is high and output U180 is low); a NOR gate NOR2 that takes the NOR between the inverse of output U180 of exclusive-NOR gate EXNOR2 and output U270 of exclusive-NOR gate EXNOR3 (the NOR is high when output U180 is high and output U270 is low); and a NOR gate NOR3 that takes the NOR between the inverse of output U270 of exclusive-NOR gate EXNOR3 and output U0 of exclusive-NOR gate EXNOR1 (the NOR is high when output U270 is high and output U0 is low).

In the phase selecting circuit PSEL, a phase calculating circuit PCAL receives P0, P90, P180, P270 from the edge detecting circuit EGDT and the m-selection signal MR<0:7> from the coarse delay register CDR as inputs and, using information concerning the clock for which phase coincides in the $0^{th}$ cycle (namely whichever of the signals P0, P90, P180, P270 is high) and the value of the m-selection MR<0:7> (the MR<i> that is high), finds the edge of the clocks B that coincides with the coarse timing signal CT in the mth cycle.

In the phase selecting circuit PSEL, a clock of clocks B (CKb0, CKb90, CKb180, CKb270) is selected by a selector SEL1 based upon phase selection signal PS<0:3> and is output as fine clock CKf0. Clocks of clocks B (CKb0, CKb90, CKb180, CKb270) are selected by selectors (SEL2, SEL3, SEL4) based upon phase selection signal PS<0:3>, and clocks B equally spaced and shifted in phase by 90° each are output as fine clocks CKb90, CKb180, CKb270.

The selector SEL1 selects CKb0, CKb90, CKb180, CKb270 in conformity with activation of PS0, PS1, PS2, PS3, respectively, and outputs CKf0. The selector SEL2 selects CKb90, CKb180, CKb270, CKb0 in conformity with activation of PS0, PS1, PS2, PS3, respectively, and outputs CKf90.

The selector SEL3 selects CKb180, CKb270, CKb0, CKb90 in conformity with activation of PS0, PS1, PS2, PS3, respectively, and outputs CKf180. The selector SEL4 selects CKb270, CKb0, CKb90, CKB180 in conformity with activation of PS0, PS1, PS2, PS3, respectively, and outputs CKf270.

When PS0 is high and PS1, PS2, PS3 are low, (CKf0, CKf90, CKf180, CKf270)=(CKb0, CKb90, CKb180, CKb270) holds.

When PS1 is high and PS0, PS2, PS3 are low, (CKf0, CKf90, CKf180, CKf270)=(CKb90, CKb180, CKb270, CKb0) holds.

When PS2 is high and PS0, PS1, PS3 are low, (CKf0, CKf90, CKf180, CKf270)=(CKb180, CKb270, CKb0, DKb90) holds.

When PS3 is high and PS0, PS1, PS2 are low, (CKf0, CKf90, CKf180, CKf270)=(CKb270, CKb0, DKb90, CKb180) holds.

Figure 8:
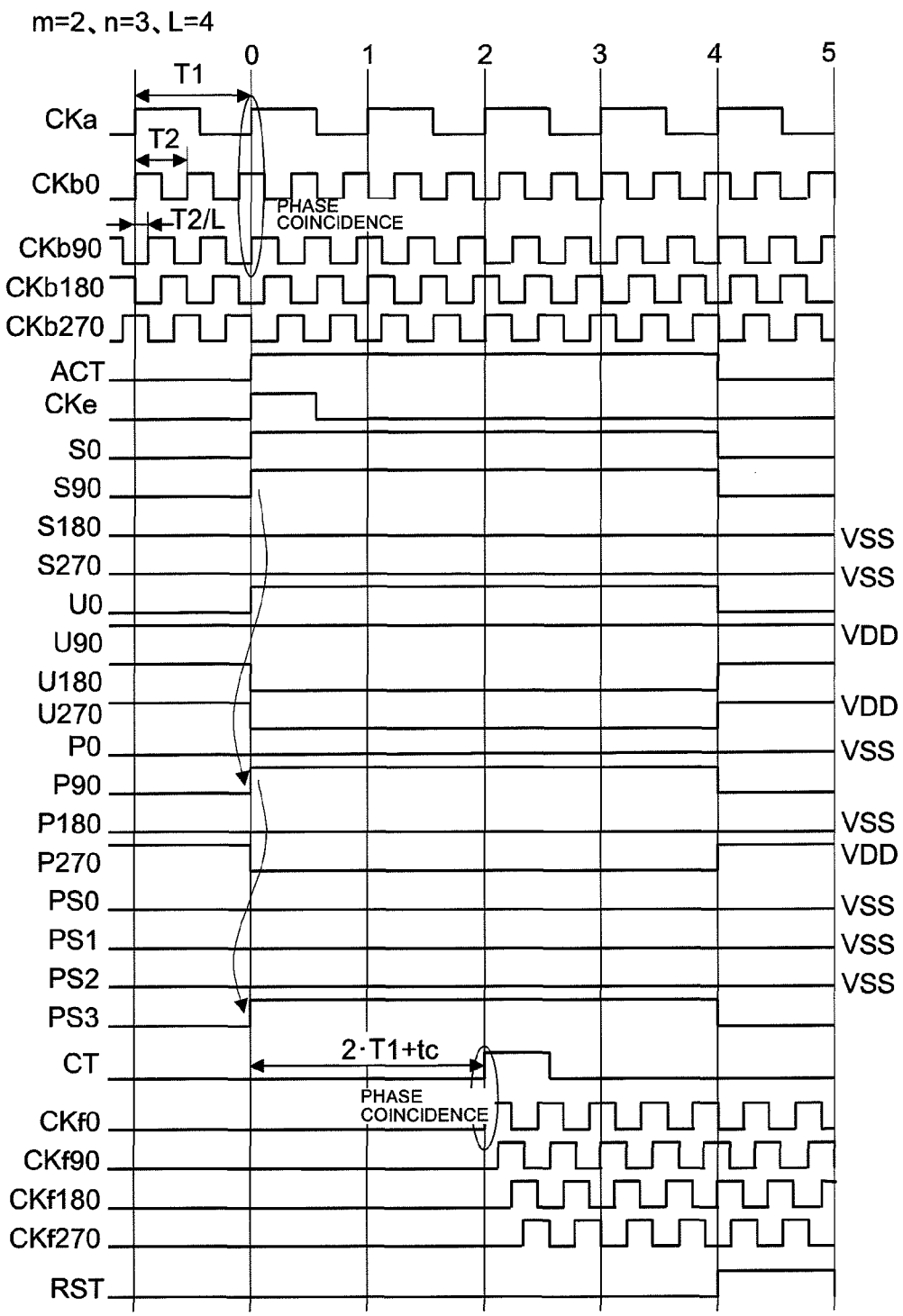
FIG. 8 is a diagram illustrating the operation waveforms of the edge detecting circuit (EGDT) and phase selecting circuit of FIG. 7.

FIG. 8 is a diagram illustrating the operation waveforms of the edge detecting circuit EGDT. In the reset state, the outputs S0 to S270 of the flip-flops are at the low level.

An inverter is inserted between signal S270 and the input to exclusive-NOR gate EXNOR0 in such a manner that among signals U0 to U270 obtained by taking the exclusive-NORs between the adjacent signals among S0 to S270, only U0 goes low and the others go high.

By taking the exclusive-NORs (detecting coincidence) between the adjacent signals among U0 to U270, P0 to P270 are output. In the initial state, P270 at the high level is selected.

In FIG. 8, the phases of the rising edges of CKa and CKb90 coincide (the rising edge of CKb0 leads the rising edge of CKa) in the $0^{th}$ cycle when the activate signal ACT has been activated. In FIG. 8, therefore, S0 and S90 go high and S180 and S270 remain low among the outputs S0 to S270 of flip-flops FF1 to FF4 that sample CKb0 to CKb270 in accordance with the rising edge of CKe. As a result, the outputs U0, U90 of exclusive-NOR gates EXNOR0, EXNOR1 go high, outputs U180, U270 of exclusive-NOR gates EXNOR180, EXNOR270 go low, only P90, which is the output of NOR gate NOR1, goes high (is activated), and this is output as the result of edge detection.

After PS3 is activated (PS3=high) by the phase calculating circuit PCAL in response to the result of edge detection and activate signal ACT is activated, clock CKb270, whose rising edge coincides with that of the coarse timing signal CT in the second cycle, is output as the fine timing clock CKf0. At this time the phase selecting circuit PSEL selects and outputs CKb0 as CKf90, CKb90 as CKf180 and CKb180 as Ckf270 by the selectors (SEL2, SEL3, SEL4).

Figure 9:
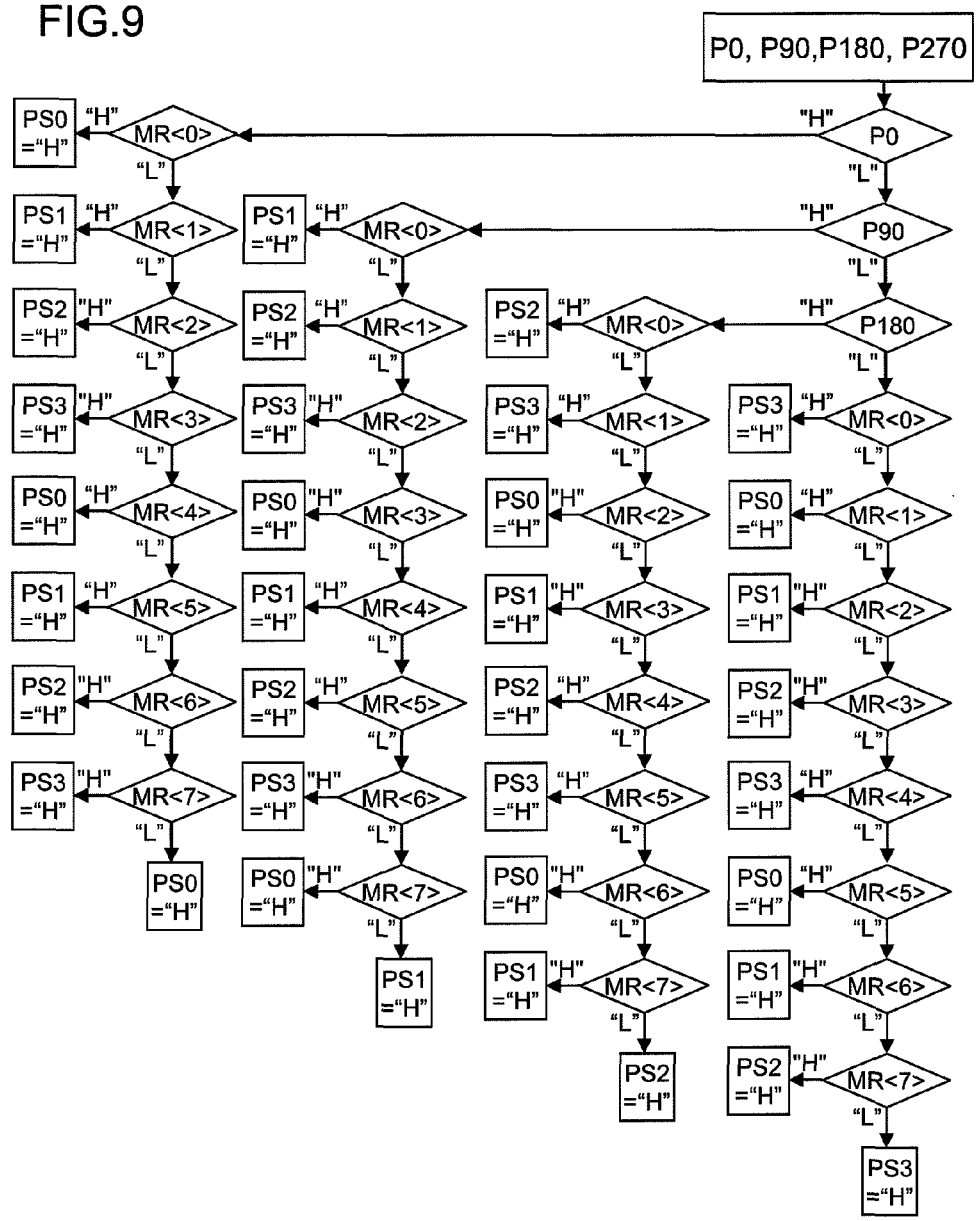
FIG. 9 is a flowchart of operations performed by a phase calculating circuit in the phase selecting circuit of FIG. 7.

FIG. 9 is a flowchart illustrating the operations performed by the phase calculating circuit PCAL of FIG. 7. This illustrates a case where the T1, the period of clock A (CKa) and the T2, the period of clock B differ and the clock B that coincides with the rising edge of clock A (CKa) is shifted phase by phase whenever clock A (CKa) advances by one cycle.

For example, if the rising edges of CKa and CKb0 coincide in the $0^{th}$ cycle, then CKb90 coincides in the first cycle and CKb180 coincides in the second cycle.

As one example, when P90 is high and MR<2> has been activated (raised to the high level), the edges of clocks A (CKa) and CKb270 coincide two cycles later and PS3, therefore, is activated.

Figure 10:
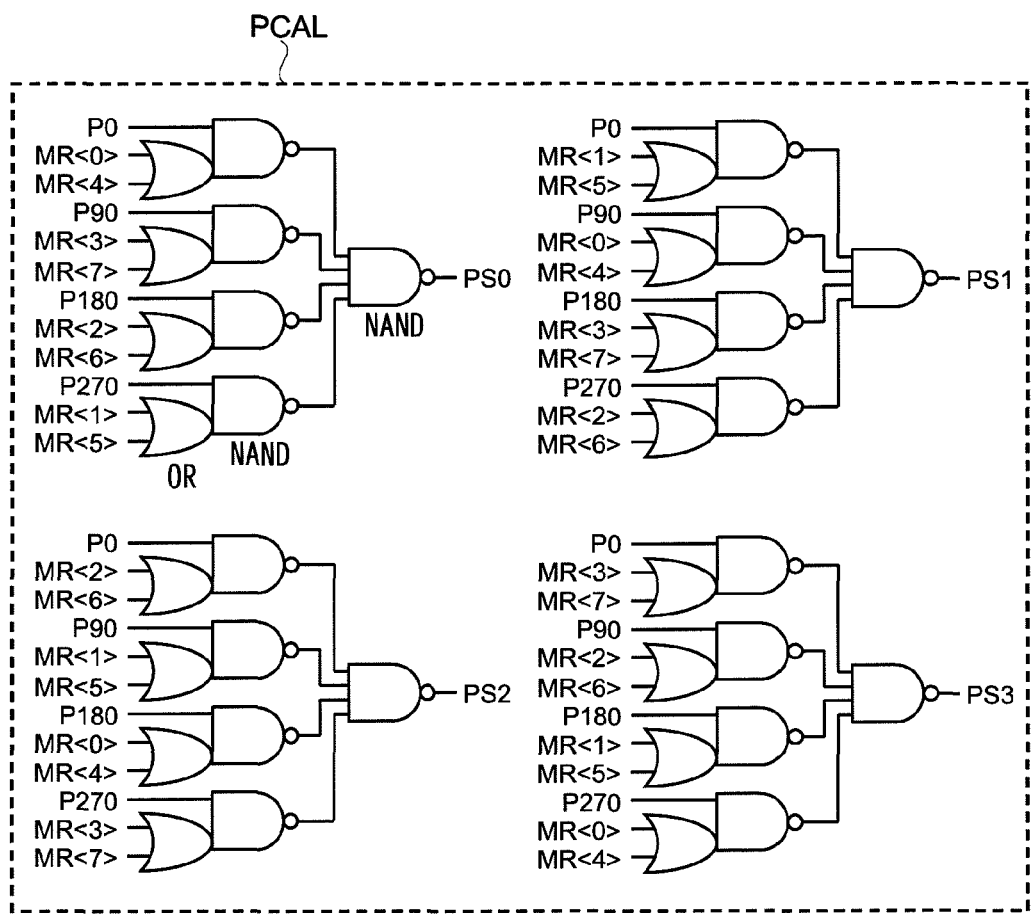
FIG. 10 is a diagram illustrating the circuit configuration of the phase calculating circuit in the phase selecting circuit of FIG. 7.

The control illustrated in the flowchart of FIG. 9 can be implemented by the phase calculating circuit PCAL shown in FIG. 10. In the phase calculating circuit PCAL, PS0 is found by the following operation: NAND (NAND (P0, OR(MR<0>, MR<4>), NAND (P90, OR(MR<3>, MR<7>), NAND (P180, OR(MR<2>, MR<6>), NAND (P270, OR(MR<1>, MR<5>)). Further, PS1 is found by the following operation: NAND (NAND (P0, OR(MR<1>, MR<4>), NAND (P90, OR(MR<0>, MR<4>), NAND (P180, OR(MR<3>, MR<7>), NAND (P270, OR(MR<2>, MR<6>)). Further, PS2 is found by the following operation: NAND (NAND (P0, OR(MR<2>, MR<6>), NAND (P90, OR(MR<1>, MR<5>), NAND (P180, OR(MR<0>, MR<4>), NAND (P270, OR(MR<3>, MR<7>)). Further, PS3 is found by the following operation: NAND (NAND (P0, OR(MR<3>, MR<7>), NAND (P90, OR(MR<2>, MR<6>), NAND (P180, OR(MR<1>, MR<5>), NAND (P270, OR(MR<0>, MR<4>)). When P90 is high, i.e., after the activate signal ACT has been activated, in a case where the clock B whose rising-edge timing coincides with that of clock A (CKa) in the $0^{th}$ cycle is the clock CKb90 and, moreover, the clock B whose rising-edge timing coincides with that of the coarse timing signal CT in the $2^{nd}$ cycle is the clock CKb270 (PS3 is high), the rising-edge timing of the clock Ckb270 will coincide with that of the coarse timing signal CT also in the $6^{th}$ cycle four cycles later.

Figure 11A:
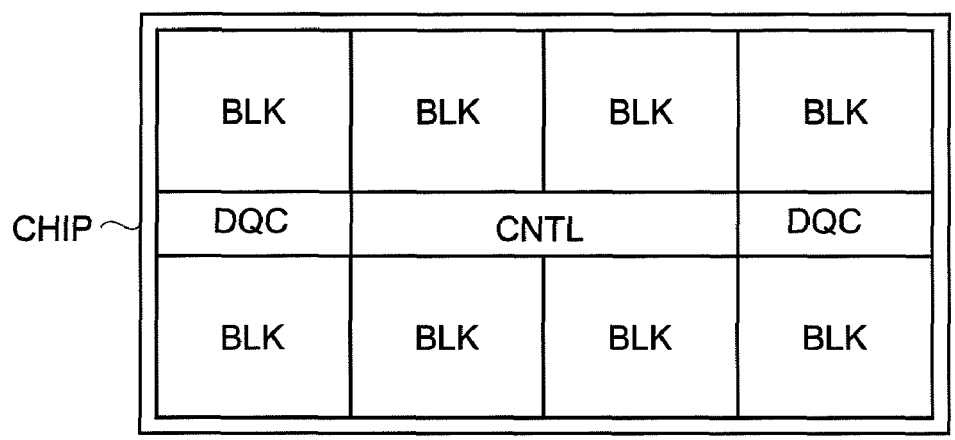
FIGS. 11A and 11B are diagrams illustrating an example of the overall configuration of a DRAM chip, which is equipped with the timing control circuit TG according to the embodiment of the present invention, and an example of the configuration of a memory bank, respectively.
Figure 11B:
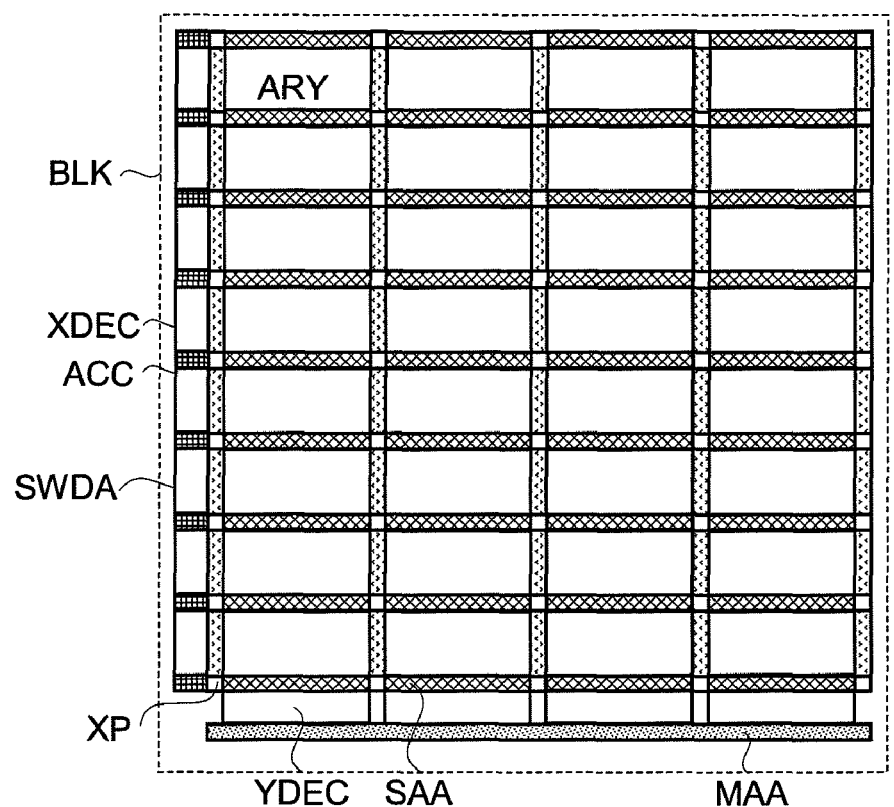

FIGS. 11A and 11B are plan views schematically illustrating an example of chip configuration in a semiconductor storage device according to an exemplary embodiment of the present invention, in which FIG. 11A is an example of the configuration of the overall chip and FIG. 11B an example of the configuration of a memory bank in FIG. 11A.

The semiconductor storage device illustrated in FIG. 11A is a DRAM. The configuration of the overall memory chip (CHIP) is broadly divided into a control circuit CNTL, input/output circuits DQC and memory blocks BLK, as illustrated in FIG. 11A.

A clock, address and control signal are supplied to the control circuit CNTL from outside the memory chip (CHIP), the operating mode of the memory chip is decided and pre-decoding of the address is carried out.

Input/output circuit DQC has an input/output buffer, etc., inputs write data from outside the memory chip and outputs read data to the exterior of the memory chip.

As shown for example in FIG. 11B, a plurality of memory arrays (ARY) in array form are disposed in the memory block, and a sense amplifier row SAA, subword driver row SWDA and cross area XP are disposed surrounding the array.

Further, a column decoder YDEC and a main amplifier row MAA are disposed in parallel with the sense amplifier row SAA at the outer periphery of the memory bank, and a row decoder XDEC and array control circuit ACC are disposed in parallel with the subword driver row SWDA at the outer periphery of the memory bank.

Figure 12:
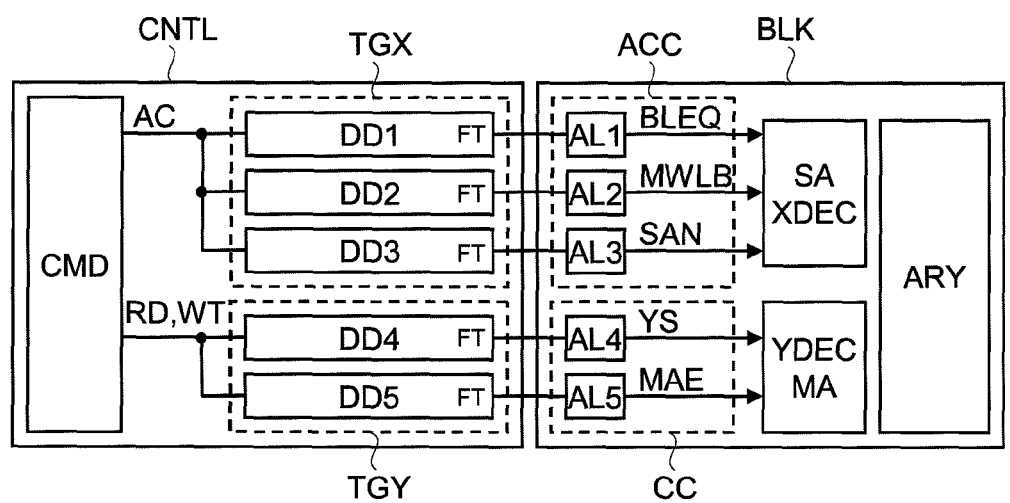
FIG. 12 is a diagram illustrating the configurations of a control circuit and memory block of the DRAM chip in FIG. 11.

FIG. 12 is a diagram illustrating an example of the configurations of the control circuit CNTL and memory block BLK. An activate command AC issued by a command decoder CMD is input to a timing control circuit TGX having the construction according to the exemplary embodiment described above. Using digital delay elements DD1 to DD3, the timing control circuit TGX generates the fine timing signals FT.

The fine timing signals FT are supplied to the memory block BLK and, after passing through logic AL within the array control circuit ACC, are used to generate the timings of a bit-line equalization signal BLEQ, main word line MWLB and sense-amplifier signal SAN used in the sense amplifier SA and row decoder XDEC.

Further, a read command RD and a write command WT issued by the command decoder CMD are supplied to a timing control circuit TGY having the construction according to the exemplary embodiment described above. Using digital delay elements DD4 to DD5, the timing control circuit TGY generates the fine timing signals FT. The fine timing signals FT are supplied to the memory block BLK and, after passing through logic AL within a column control circuit CC, are used to generate the timings of a column select signal YS and main-amplifier activate signal MAE used in the column decoder YDEC and main amplifier MA.

By using the timing control circuits TGX, TGY described in the exemplary embodiment set forth above, it is possible to reduce amount of fluctuation in these timings ascribable to variations in process, supply voltage and temperature, and access time can be shortened.

Figure 13:
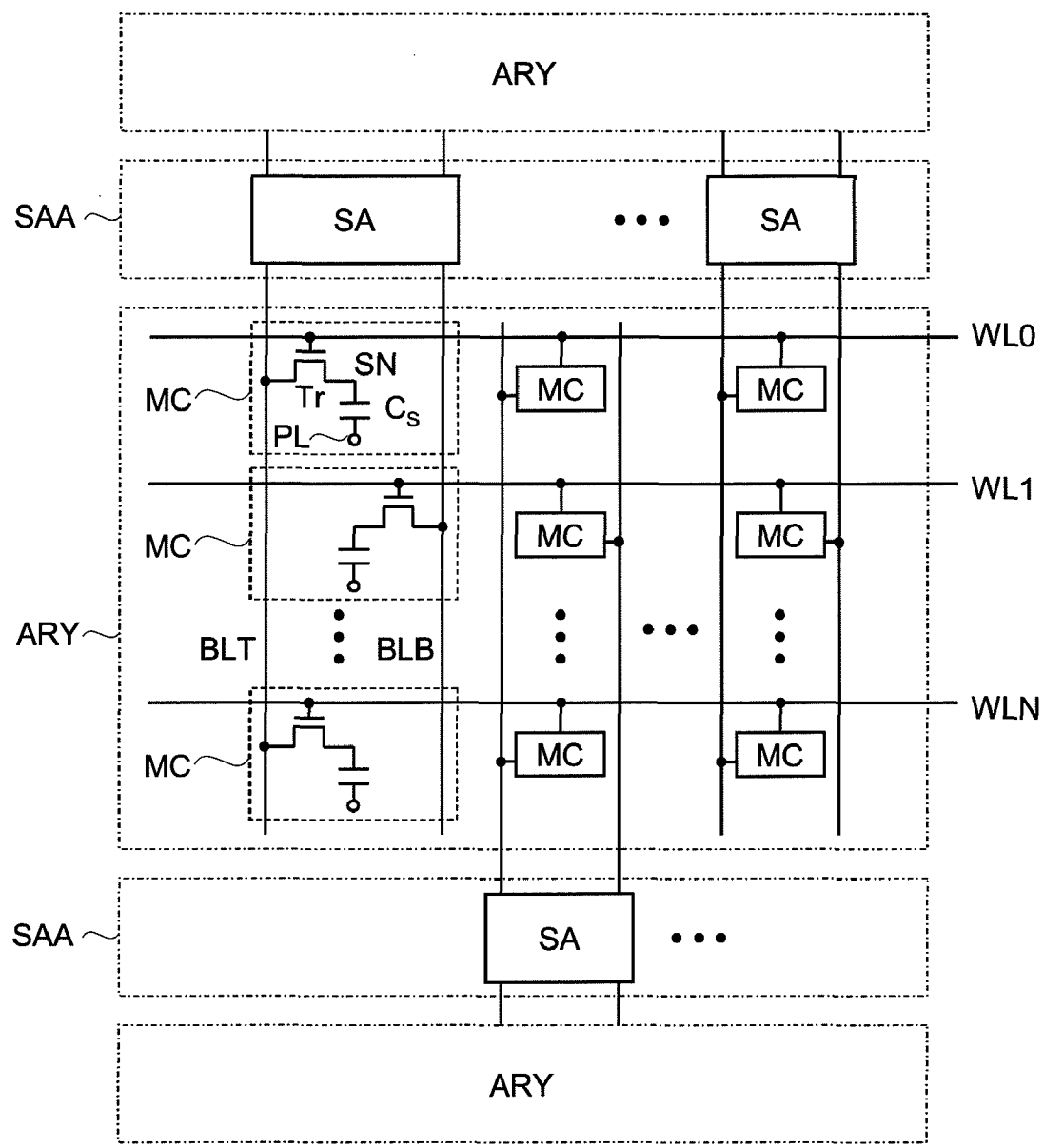
FIG. 13 is a diagram illustrating the circuit configuration of one example (folded bit line) of a memory array used by the DRAM chip of FIG. 11.
Figure 14:
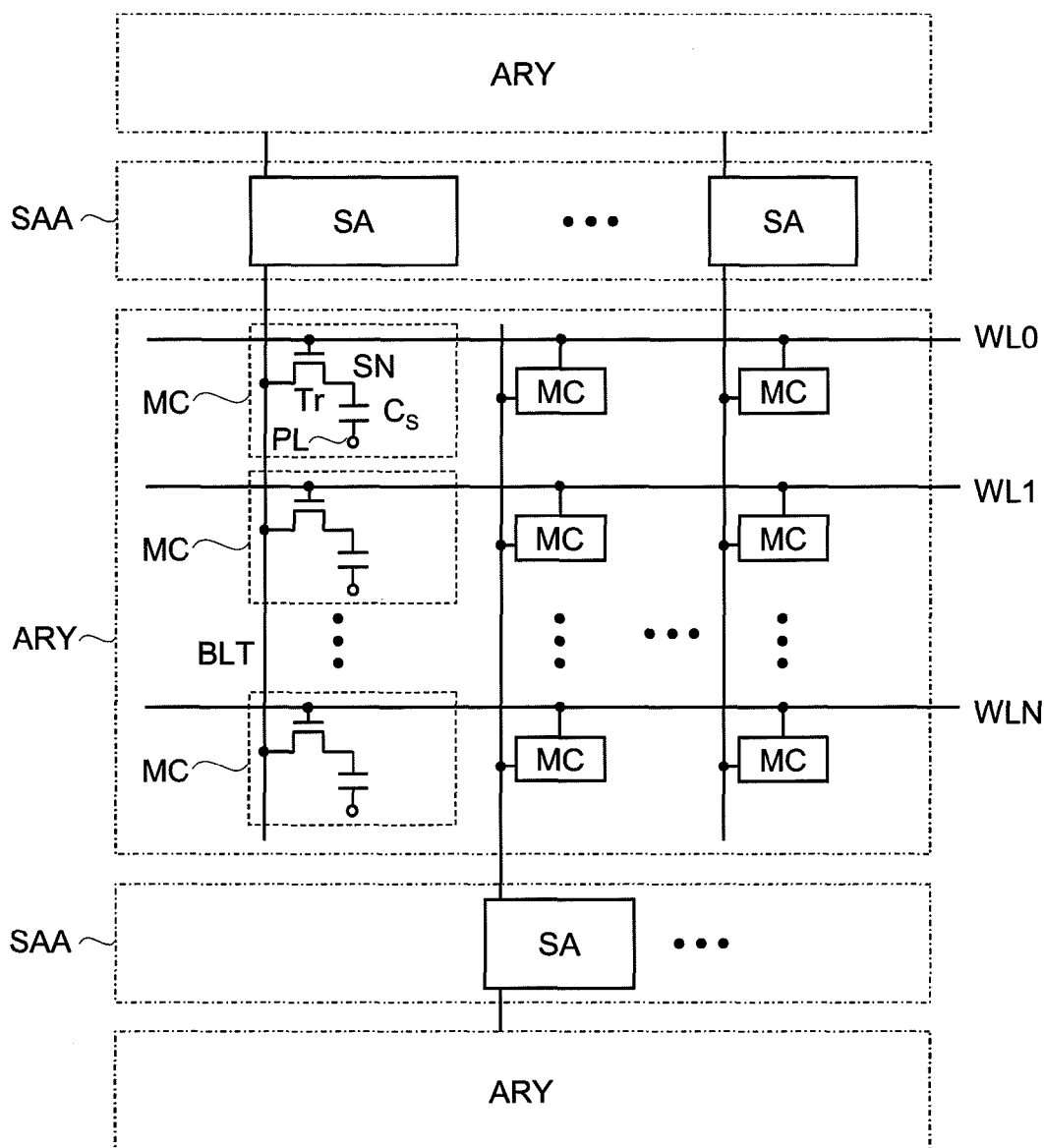
FIG. 14 is a diagram illustrating the circuit configuration of another example (open bit line) of a memory array used by the DRAM chip of FIG. 11.

FIGS. 13 and 14 are diagrams illustrating examples of memory-array configurations in the semiconductor storage device of FIGS. 11A, 11B. As illustrated in FIGS. 13 and 14, memory arrays ARY are composed of a plurality of memory cells MC. Each memory MC is a DRAM memory cell and is constituted by a single MOS transistor Tr and a single capacitor Cs. Either the source or drain of the memory cell transistor Tr is connected to a bit line (BLT or BLB), and the other of the source and drain is connected to a storage node SN. The gate is connected to a word line WL.

One end of the capacitor Cs is connected to the storage node SN, and the other end is connected to a common plate PL. It should be noted that the bit line BLT and bit line BLB function as a bit-line pair (complementary bit lines) and are connected to the same sense amplifier SA.

Sense amplifier rows SAA are placed above and below the memory array ARY and alternate with it, are connected in common with the bit-line pairs (BLT/BLB) within the memory arrays ARY above and below, and are shared by the two. Further, within each sense amplifier row SAA, adjacent sense amplifiers are placed astride a space equivalent to one bit-line pair. By adopting this arrangement, the pitch of the sense amplifiers SA is reduced, layout of the sense amplifiers SA is facilitated and microfabrication is possible.

The configuration shown in FIG. 13 uses a folded type bit line array, in which memory cells are placed at half of the intersections of word and bit lines. This array is advantageous in that noise at the time of operation is small and in that the operating margin is large.

The configuration shown in FIG. 14 uses an open bit line array, in which memory cells are placed at all of the intersections of word and bit lines. This is advantageous in that the size of memory cells can be reduced.

Figure 15:
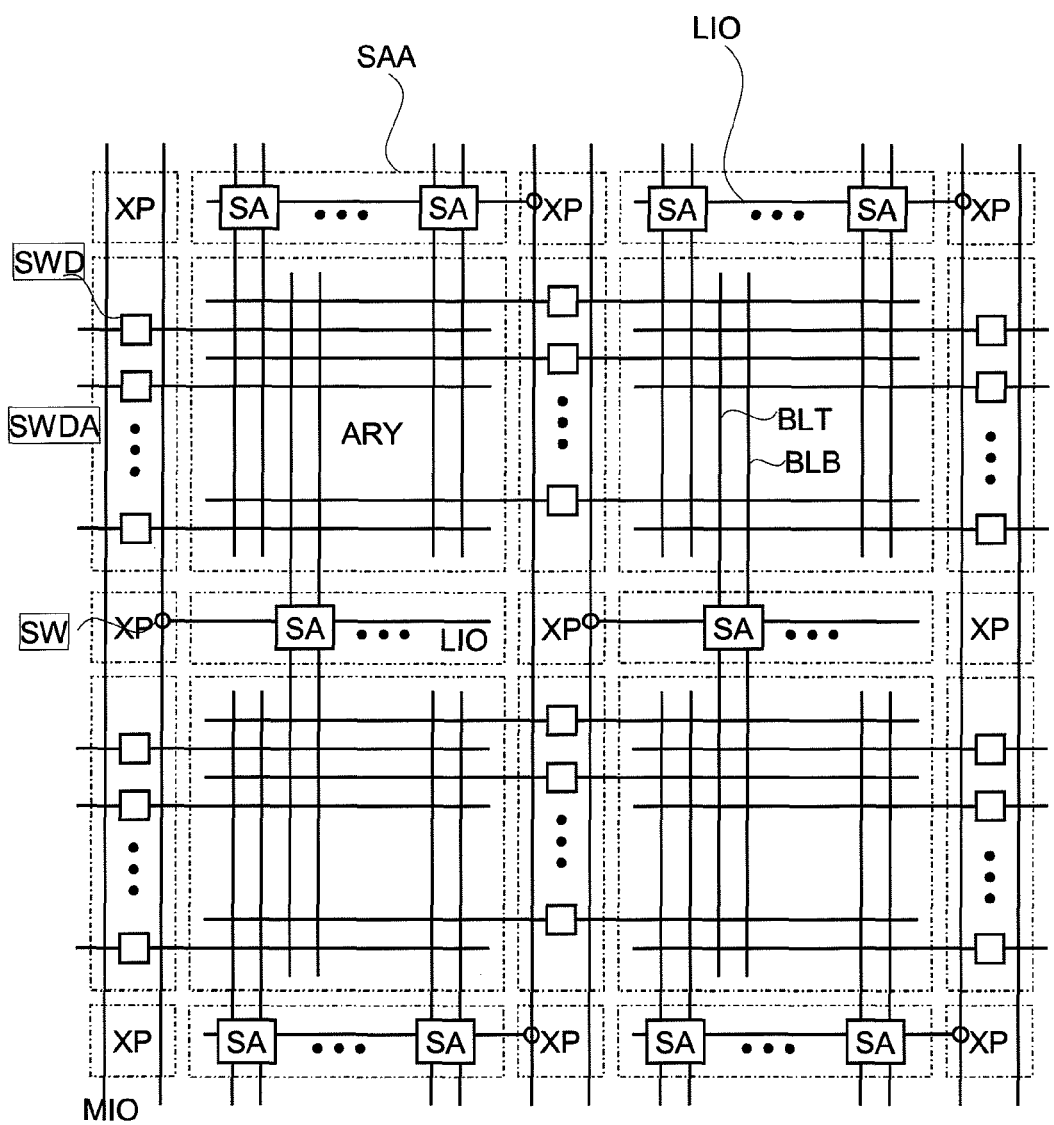
FIG. 15 is a diagram illustrating a circuit configuration indicating connections among memory arrays, subword driver rows and sense amplifier rows used in the DRAM chip of FIG. 11A.

FIG. 15 is a plan view illustrating an example of the details of the placement arrangement of sense amplifier rows and subword driver rows in the semiconductor storage device of FIGS. 11A, 11B. As shown in FIG. 15, sense amplifiers SA in sense amplifier rows SAA are placed above and below memory arrays ARY, alternate with them and are connected in common with bit-line pairs BLT/BLB within the memory arrays ARY above and below.

Similarly, subword drivers SWD in subword driver rows SWDA are placed at the right and left of the memory arrays ARY, alternate with them and are connected in common with word lines WL within the memory arrays ARY to the right and left. By adopting such an arrangement, the pitch of the subword drivers SWD in the subword driver row SWDA can be widened to twice the pitch of the word lines WL in the memory array ARY.

Further, a local I/O line LIO is disposed in the sense amplifier row SAA, and the I/O line is connected to a main I/O line MIO via a switch SW in a cross area XP.

At the time of a read operation, the data in the sense amplifier SA is read out to the exterior of the chip via the local I/O line LIO and main I/O line MIO. At the time of a write operation, data is written to the sense amplifier SA from outside the chip via the main I/O line MIO and local I/O line LIO.

Figure 16:
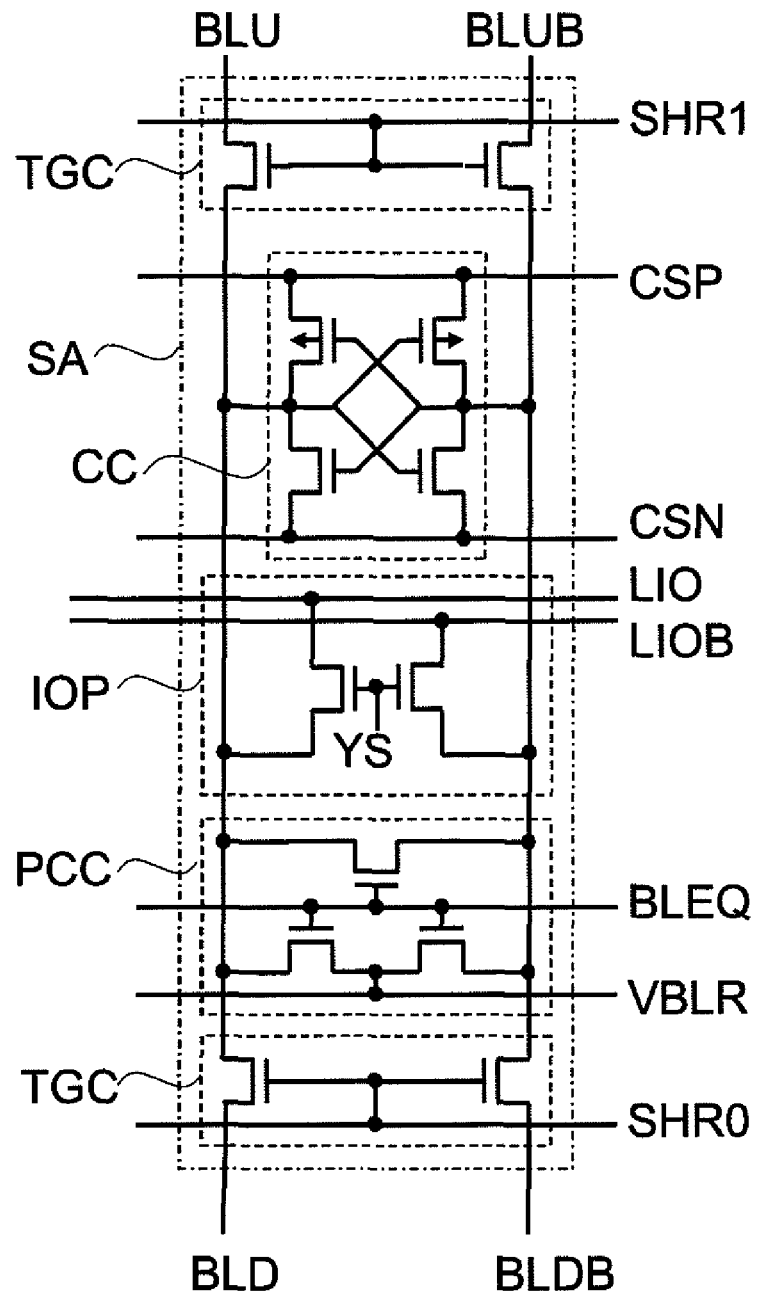
FIG. 16 is a diagram illustrating the circuit configuration of a sense amplifier used by the DRAM chip of FIG. 11A.

FIG. 16 is a diagram illustrating an example of the configuration of a sense amplifier. Included within each sense amplifier SA are a transfer gate TGC, a precharging circuit PCC, a cross-coupled amplifier CC and a read/write port IOP.

The transfer gate TGC is a circuit that connects bit lines BLD, BLDB of the sense amplifier SA and bit lines BLU, BLUB of the memory array ARY when a sense-amplifier isolation signal (SHR signal) is activated.

The precharging circuit PCC equalizes the bit-line pair (BLT, BLB) and precharges the pair to a bit-line precharge level VBLR when the bit-line equalization signal BLEQ is activated. The bit-line precharge level VBLR usually is set to VDL/2, which is the midpoint of a voltage VDL of the bit-line amplitude (a level the same as or stepped down from that of supply voltage VCC provided from outside the chip).

The cross-coupled amplifier CC is a circuit which, after a very small readout signal from the memory cell MC has been generated on the bit-line pair, drives a common-source line CSP on the side of a PMOS transistor to voltage VDL, drives a common-source line CSN on the side of an NMOS transistor to ground voltage VSS, amplifies whichever of the bit lines BLD, BLDB has the higher voltage to VDL, amplifies whichever of the bit lines BLD, BLDB has the lower voltage to VSS and latches the amplified voltages.

The read/write port IOP is a circuit for connecting local I/O line (LIO line) LIOT/LIOB to bit-line pair BLD/BLDB when column select line YS is activated. It should be noted that LIO line LIOT/LIOB is held at the precharge level at the time of standby in order to prevent current consumption in a non-selected sense amplifier row SAA.

Figure 17:
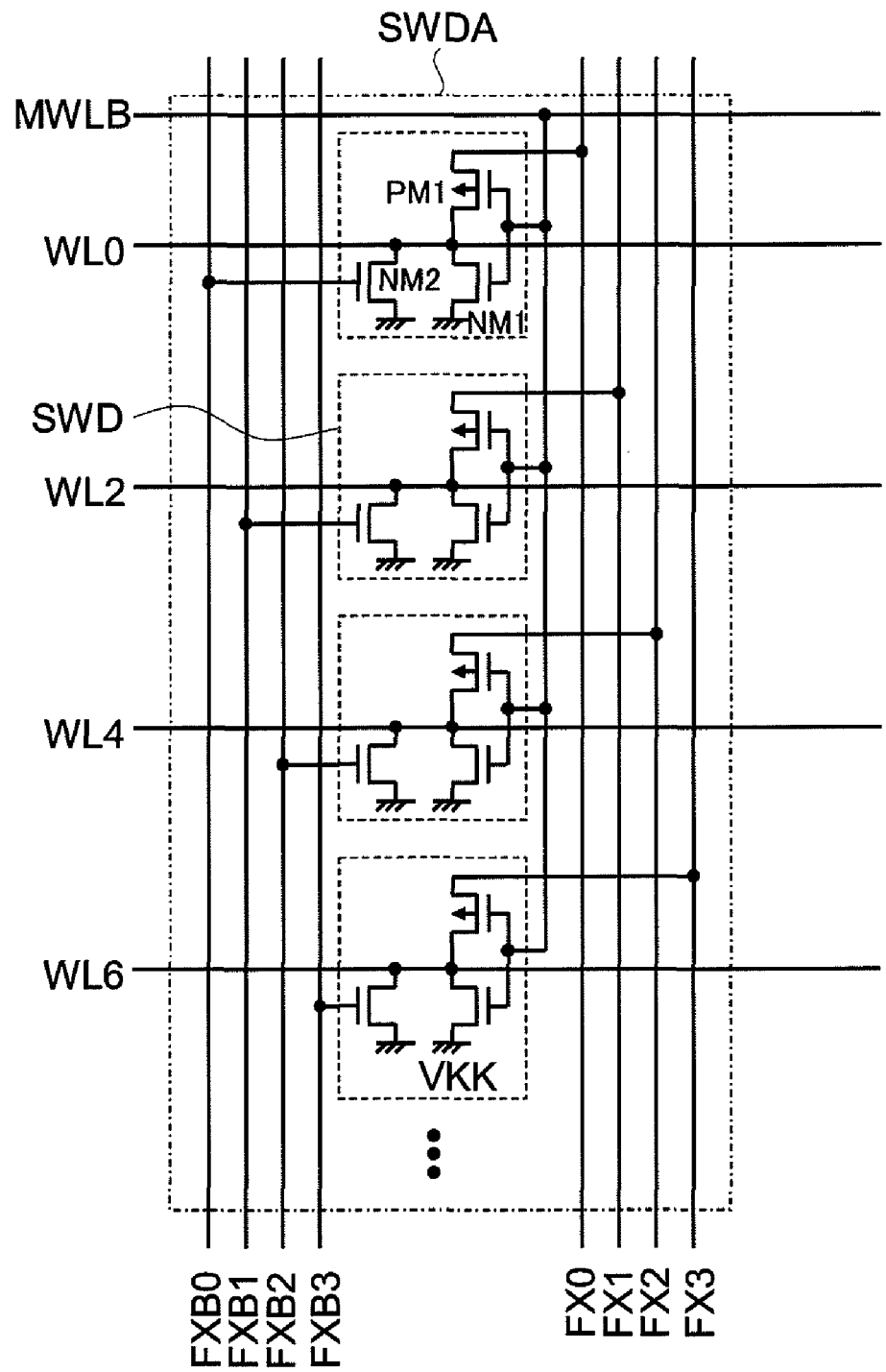
FIG. 17 is a diagram illustrating the circuit configuration of a subword driver used by the DRAM chip of FIG. 11A.

FIG. 17 is a diagram illustrating an example of the configuration of the subword driver row in the semiconductor storage device of FIG. 11. The subword driver row SWDA is composed of a plurality of subword drivers SWD. The subword driver row SWDA is disposed at the periphery of the memory array ARY, as illustrated in FIG. 11B, etc.

The subword driver SWD drives word lines WL in memory arrays ARY disposed on both sides. As described with reference to FIG. 15, the subword driver rows SWDA are disposed alternatingly with the memory arrays ARY, and therefore the word lines WL (subword lines) in the memory arrays ARY are connected to the left and right subword drivers SWD every other line.

The subword driver SWD is composed of two N-channel MOS transistors NM1, NM2 and a P-channel MOS transistor PM1. One N-channel MOS transistor NM1 has a gate to which the main word line MWLB is connected, a drain to which a word line WL is connected and a source to which voltage VKK is connected. The other N-channel MOS transistor NM2 has a gate to which a complementary word driver select line FXBi (i=1, 2, 3) is connected, a drain to which a word line WL is connected and a source to which voltage VKK is connected. The voltage VKK is a voltage lower than VSS generated by a negative-voltage generating circuit.

The P-channel MOS transistor PM1 has a gate to which main word line MWLB is connected, a drain to which word line WL is connected and a source to which a subword driver select line FXi (i=1, 2, 3) is connected.

Four subword driver select lines FX0 to FX3 are wired on one subword driver row SWDA, and any one among four subword drivers SWD selected by one main word line MWLB is selected and one word line WL is activated.

Figure 18:
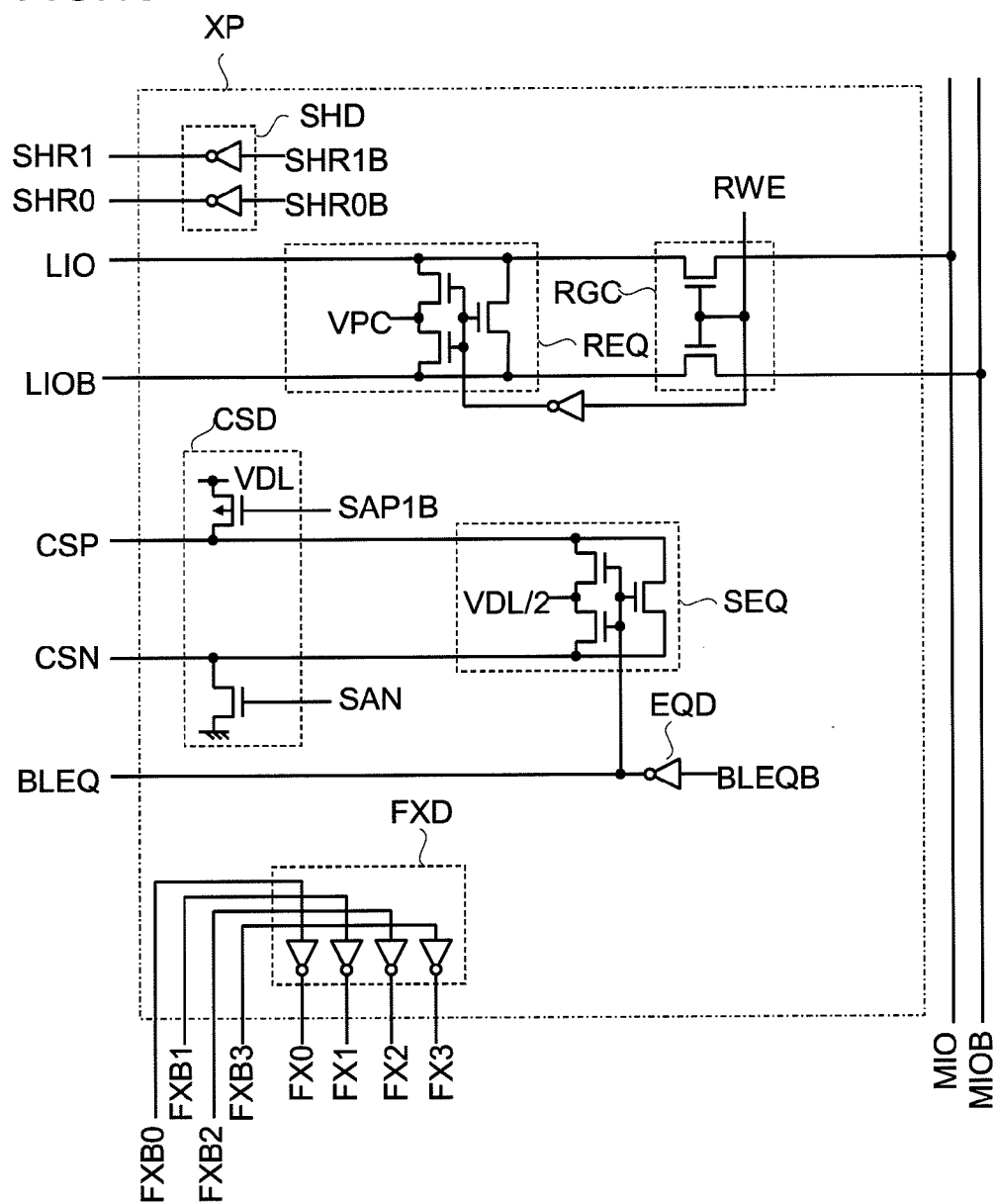
FIG. 18 is a diagram illustrating the circuit configuration of a cross area used by the DRAM chip of FIG. 11A.
Figure 19A:
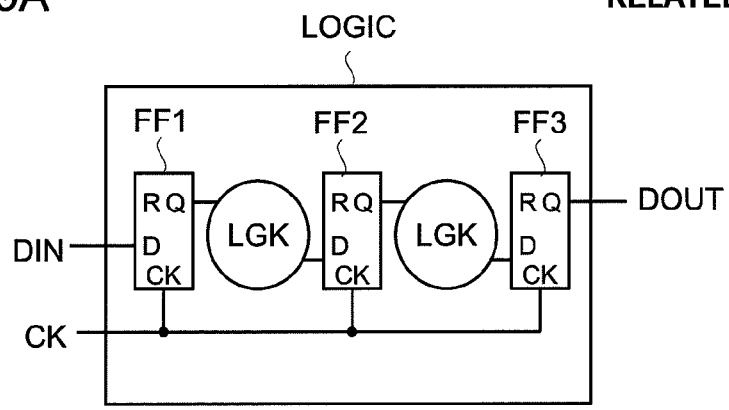
FIGS. 19A and 19B are diagrams illustrating timing control schemes in a logic LSI chip and synchronous DRAM, respectively.
Figure 19B:
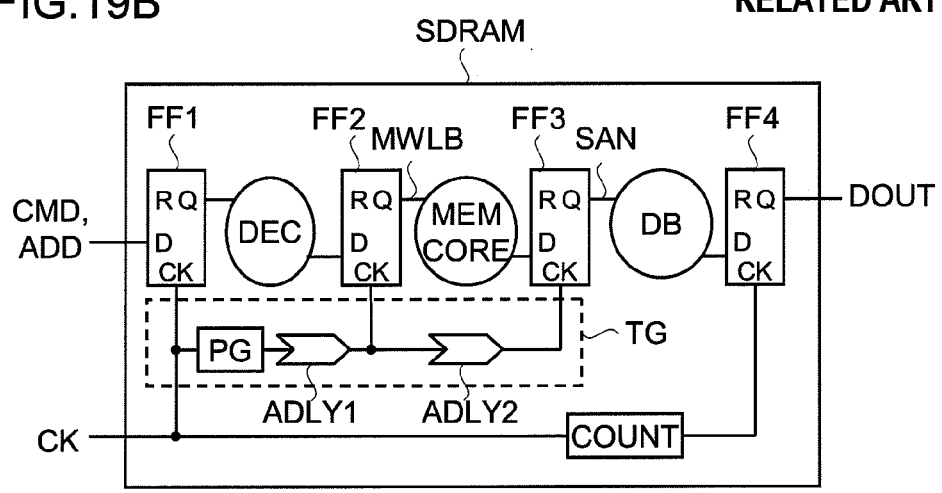
Figure 20A:
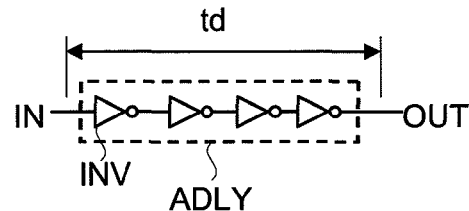
FIGS. 20A and 20B are diagrams illustrating the circuit configuration and delay characteristic, respectively, of an analog delay used in a conventional timing control scheme in a synchronous DRAM.
Figure 20B:
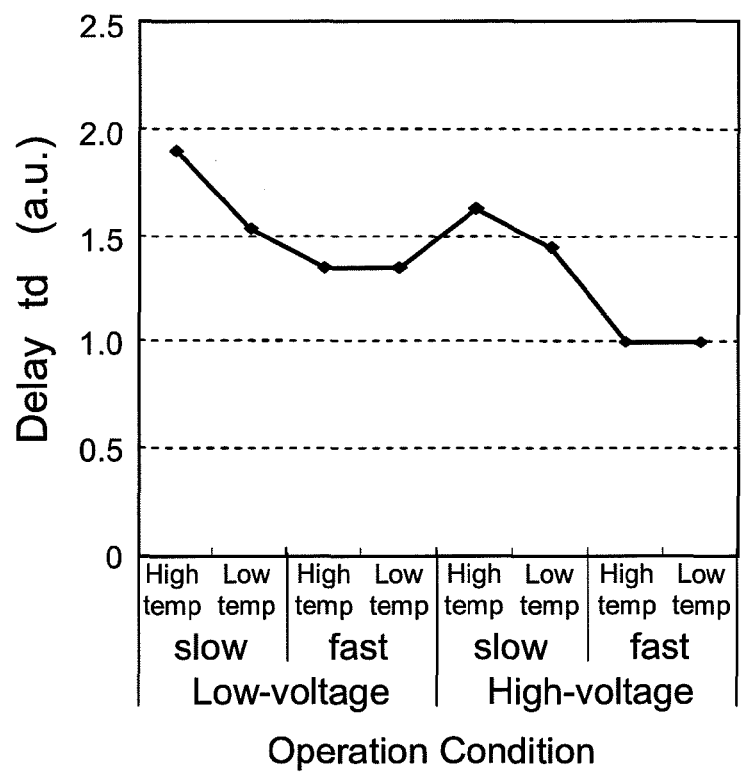

FIG. 18 is a diagram illustrating an example of the configuration of the cross area XP in the semiconductor storage device of FIG. 11. As shown in FIG. 18, the cross area XP includes an SHR signal driver SHD, an LIO line precharging circuit REQ, a read/write gate RGC, a CS line driver CSD, a CS line precharging circuit SEQ, a BLEQ signal driver EQD, and an FX line driver FXD.

The SHR signal driver SHD receives a complementary signal SHRB of the SHR signal as an input and outputs a signal that is the inverse of this signal. The LIO line precharging circuit REQ precharges the LIO line LIOT/B to voltage VPC when a read/write-enable signal RWE is at the VSS level, which is the deactivated state.

The read/write gate RGC connects the LIO line LIOT/B and the main IO line MIOT/B when the read/write-enable signal RWE is at the activated-state voltage VCL (a level the same as or stepped down from the external VCC level and used as supply voltage for peripheral circuits).

The CS line driver CSD drives the NMOS-side common-source line CSN (see FIG. 16) of the sense amplifier to the ground voltage VSS when the NMOS-side sense-amplifier enable signal SANS is in the activated state, and drives the PMOS-side common-source line CSN (see FIG. 16) of the sense amplifier to the voltage VDL (the high level of the bit line) when the PMOS-side sense-amplifier enable signal SAPIB is in the activated state (VSS level).

The CS line precharging circuit SEQ precharges the PMOS-side and NMOS-side common-source lines CSP, CSN (see FIG. 16) to VDL/2 when the BLEQ signal has been activated.

The BLEQ signal driver EQD receives a complementary signal BLEQB of the precharging signal BLEQ as an input and outputs a signal that is the inverse of this signal.

The FX line driver FXD receives signal FXB as an input and outputs the complementary signal to subword line driver select line FX (FX line).

The timing control signal of the present invention represents a technology particularly useful in application to DRAM products, etc. However, the signal is not limited to such application and is also applicable to on-chip memories and the like incorporated within a logic chip of a microprocessor or DSP (Digital Signal Processor), etc. Furthermore, according to the present invention, since time for locking as in a DLL having a feedback loop is not required, the invention is applicable to any timing generator and system.

The entire disclosure of Patent Documents 1 and 2 and Non-Patent Document 1 are incorporated herein by reference thereto. Though the present invention has been described in accordance with the foregoing exemplary embodiments, the invention is not limited to these exemplary embodiments and it goes without saying that the invention covers various modifications and changes that would be obvious to those skilled in the art within the scope of the claims.

What is claimed is:

1. A timing control circuit comprising:
a digital delay circuit that receives a first clock signal having a first period, a group of second clocks having a second period with phases spaced apart from each other at a prescribed interval, an activate signal, and a selection signal for setting a delay amount, the digital delay circuit outputting a timing signal delayed by a delay amount that is a combination of a delay time which is a prescribed multiple of the first period and a delay time which is a prescribed multiple of a length of time corresponding to the phase interval between adjacent clock signals of the group of second clocks, the prescribed multiple of the first period being not less than twice the first period, the delay times being specified by the selection signal, with an effective edge of the first clock signal at the time when the activate signal is activated serving as a reference of the delay times.

2. The circuit according to claim 1, wherein a delay time from the effective edge of the first clock signal at the time when the activate signal is activated to an effective edge of the timing signal, is specified by the sum of m·T1 and n·(T2/L), where
T1 is the first period,
T2 is the second period,
L is a prescribed positive integer indicating the number of phase clocks of the group of second clocks,
the phase between the adjacent clock signals of the group of second clocks being T2/L, and
m and n are non-negative integers specified by the selection signal.

3. The circuit according to claim 2,
wherein m and n are recorded in a register so as to be capable of being varied.

4. The circuit according to claim 1,
wherein the digital delay circuit includes:
a coarse delay circuit that outputs a coarse timing signal with a delay amount m·T1, where T1 is the first period, and m is a non-negative integer specified by the selection signal, from the effective edge of the first clock at the time when the activate signal is activated; and
a fine delay circuit that selects a first one of the second clock signals from among said group of second clocks, which has an effective edge of a timing identical with that of an effective edge of the coarse timing signal in an mth cycle from the effective edge of the first clock signal at the timing when the activate signal is activated, based upon a detected signal associated with a result of detection of a second one of the second clock signals from among said group of second clocks having an effective edge at a timing simultaneous with or immediately following the effective edge of the first clock signal at the timing when the activate signal is activated,
generates an L-phase fine clock group by rearranging the group of second clocks in such a manner that the selected first one of the second clock signals will become a first-phase clock signal among L-phase clock signals in said L-phase fine clock group, and
outputs a fine timing signal having a delay amount n·(T2/L) from the effective edge of the coarse timing signal, based upon the generated L-phase fine clock group, where T2 is the second period, n is a non-negative integer specified by the selection signal, and T2/L is the phase between adjacent clock signals of the group of L phase second clocks.

5. The circuit according to claim 4,
wherein the selected first one of the second clock signals from among the group of second clocks is be the same as the detected second one of the second clock signals from among the group of second clocks.

6. A semiconductor storage device including the timing control circuit set forth in claim 1 as a circuit for controlling timing within a chip.

7. The semiconductor storage device according to claim 6, wherein the semiconductor storage device is a DRAM (Dynamic Random-Access Memory), and timing generated by the timing control circuit is used for at least one among bit-line de-equalization, word-line activation, sense-amplifier activation, column-select line activation and main-amplifier activation.

8. A semiconductor device including the timing control circuit set forth in claim 1 as a circuit for controlling timing within a chip.

9. A timing control circuit comprising:

a coarse delay circuit that receives a first clock signal having a first period, an activate signal and a first selection signal from a coarse-adjustment register, and outputs a coarse timing signal with a delay amount m·T1, where T1 is the first period and m is a non-negative integer specified by the first selection signal, from an effective edge of the first clock signal at the time when the activate signal is activated; and a fine delay circuit that receives a group of second clocks comprising L-number of second clock signals having a second period with phases spaced apart from each other by T2/L, where T2 is the second period and L represents a prescribed integer equal to or greater than 2, the coarse timing signal output from the coarse delay circuit, the first selection signal from the coarse-adjustment register and a second selection signal from a fine-adjustment register, selects a first one of the second clock signals from among said group of second clocks, which has an effective edge of a timing identical with that of an effective edge of the coarse timing signal in an mth cycle from the effective edge of the first clock signal, based upon a detected signal associated with a result of detection of a second one of the second clock signals from among said group of second clocks having an effective edge at a timing simultaneous with or immediately following the effective edge of the first clock signal at the timing when the activate signal is activated, generates an L-phase fine clock group by rearranging the group of second clocks in such a manner that the selected first one of the second clock signals will be positioned as a first-phase clock signal among L-phase clock signals in said L-phase fine clock group, and outputs a fine timing signal having a delay amount n·(T2/L), where n is a non-negative integer specified by the second selection signal, from the effective edge of the coarse timing signal, based upon the generated L-phase fine clock group.

10. The circuit according to claim 9, wherein the coarse delay circuit includes:

a shift register that transfers a fixed value successively in response to a shift clock supplied thereto;

a gate circuit that receives the first clock signal and the activate signal, transmits and outputs the first clock signal when the activate signal is in an activated state, and masks the first clock signal when the activate signal is in a deactivated state, a clock signal output from the gate circuit being used as the shift clock of the shift register;

a plurality of switches that are provided in correspondence with the first selection signal from the coarse-adjustment register and have input ends to which the clock signal from the gate circuit is applied in common and output ends connected in common to a node;

wherein from among the plurality of the switches, a switch selected in correspondence with the value m of the first selection signal from the coarse-adjustment register are turned on, based upon the output of the shift register, at the time when the fixed value has been shifted to an mth stage of the shift register, the mth stage corresponding to the first selection signal; and m cycles, where m is specified by the first selection signal, after the effective edge of the first clock signal at the time when at which the activate signal is activated, the clock signal from the gate circuit is output to the node and the coarse timing signal is output.

11. The circuit according to claim 10, wherein the coarse delay circuit includes a circuit which, when the first selection signal is activated, sets a switch corresponding to the first selection signal from the OFF to the ON state, based upon the output of the shift register, at the time when the fixed value has been shifted to an mth stage of the shift register that corresponds to value m of the first selection signal, and sets the switch from the ON to the OFF state at the time when the fixed value is shifted to an (m+1)th stage in the shift register, and which when the first selection signal is in a deactivated state, turns the switch OFF.

12. The circuit according to claim 10, wherein the coarse delay circuit includes a buffer circuit which buffers the signal at the node to which the output ends of the plurality of the switches are connected in common and outputs the coarse timing signal, the buffer circuit including:

an inverting circuit which receives the signal at the node; and a switch which, when the output of the inverting circuit is of a first logic value, connects the node to a terminal having a potential corresponding to a second logic value.

13. The circuit according to claim 10, wherein in the coarse delay circuit, a signal that is the inverse of a clock signal output from the gate circuit is used as the shift clock in the shift register.

14. The circuit according to claim 9, wherein the fine delay circuit includes:

an edge detecting circuit that receives the group of second clocks, and detects a second the second one of the second clock signals, from among the group of second clocks, having an effective edge that transitions simultaneous with or immediately following the effective edge of the first clock signal, which is supplied when the activate signal is in the activated state;

a phase selecting circuit that receives a detection signal from the edge detecting circuit, selects the first one of the second clock signal from among said group of second clocks, which has an effective edge of a timing identical with that of the effective edge of the coarse timing signal, in an mth cycle from the effective edge of the first clock signal at the timing when the activate signal is activated, based upon the first selection signal (value m), generates a phase selection signal in such a manner that the selected first one of the second clock signals will be positioned as a first-phase clock signal among L-phase-clock signals in said L-phase fine clock group, and generates the L-phase fine clock group by rearranging the group of second clocks, based upon the phase selection signal; and a delay generating circuit that selects, based upon the fine clock group, a signal corresponding to a delay that is a multiple n of (T2/L), from signals obtained by sampling the coarse timing signal at phases that differ from each other every (T2/L), and outputs the selected signal as the fine timing signal.

15. The circuit according to claim 14, wherein in the fine delay circuit, the edge detecting circuit includes:

a plurality of flip-flops that sample the group of second clocks with the first clock signal, which is input when the activate signal is in the activated state;

a plurality of coincidence detecting circuits that are provided in correspondence with the plurality of the flip-flops and that detect coincidence between outputs of adjacent flip-flops; and a plurality of gate circuits, each of which receives an output from an associated one of the coincidence detecting circuits and from an adjacent coincidence detecting circuit, and outputs an activated signal when the one coincidence detecting circuit indicates coincidence and the adjacent coincidence detecting circuit indicates non-coincidence.

16. The circuit according to claim 15, wherein inputs to one of the coincidence detecting circuits in the edge detecting circuit of the fine delay circuit are an output signal from a corresponding flip-flop and an inverted signal obtained by inverting the output of an adjacent flip-flop.

17. The circuit according to claim 14, wherein in the fine delay circuit, the phase selecting circuit includes:

a phase calculating circuit that receives a detection signal from the edge detecting circuit, selects a first one of the second clock signals from among said group of second clocks, which has an effective edge of a timing identical with that of the effective edge of the coarse timing signal, in an mth cycle from the effective edge of the first clock signal at the timing when the activate signal is activated, based upon the selection signal (value m), and generates a phase selection signal in such a manner that the selected first one of the second clock signals will become a first-phase clock signal among L-phase clock signals in said L-phase fine clock group; and first to Lth selectors that select clock signals of first to Lth phases, based upon the phase selection signal, from the group of second clocks.

18. The circuit according to claim 17, wherein in the phase selecting circuit of the fine delay circuit, clock signals of first to Lth phases of the group of second clocks are supplied to first inputs of respective ones of first to Lth selectors;

clock signals of second to Lth phases and of the first phase of the group of second clocks are supplied to second inputs of the first to Lth selectors;

clock signals of the Lth phase and of the first to (L−1)th phases of the group of second clocks are supplied to Lth inputs of the first to Lth selectors; and the first to Lth selectors select and output one of the first to Lth inputs based upon the phase selection signal.

19. The circuit according to claim 14, wherein in the fine delay circuit, the delay generating circuit includes:

a flip-flop group that receive the coarse timing signal in common, and sample the input coarse timing signal at respective ones of the clock signals of the fine clock group; and a selecting circuit that selects and outputs, as the fine timing signal, the output of a flip-flop, which corresponds to n specified by the second selection signal from the fine-adjustment register, from among outputs of the flip-flop group.

20. The circuit according to claim 19, wherein in the fine delay circuit, the delay generating circuit includes another flip-flop group, which receive outputs from respective flip-flops of the flip-flop group respectively, and sample the respective outputs at each of the clock signals of the fine clock group; and the selecting circuit selects and outputs, as the fine timing signal, the output of a flip-flop corresponding to n specified by the second selection signal from the fine-adjustment register, from among outputs of the flip-flop group and another flip-flop group.

21. The circuit according to claim 9, wherein the selected first one of the second clock signals from among the group of second clocks is be the same as the detected second one of the second clock signals from among the group of second clocks.

22. A timing generation method comprising:

responsive to a first clock signal having a first period, an activate signal and a first selection signal for setting a coarse delay, outputting a coarse timing signal with a delay amount $m \cdot T1$, where $T1$ is the first period and m is a non-negative integer specified by the first selection signal, from an effective edge of the first clock signal at the time when the activate signal is activated; and responsive to a group of second clocks comprising L-number of second clock signals having a second period with phases spaced apart from each other by $T2/L$, where $T2$ is the second period and L represents a prescribed integer equal to or greater than 2, the coarse timing signal, the first selection signal and a second selection signal for setting a fine delay, selecting a first one of the second clock signals from among said second group of clocks, which has an effective edge of a timing identical with that of an effective edge of the coarse timing signal in an mth cycle from the effective edge of the first clock signal, based upon a detected signal associated with a result of detection of a second one of the second clock signals from among said group of second clocks having an effective edge at a timing simultaneous with or immediately following the effective edge of the first clock signal at the timing when the activate signal is activated, generating an L-phase fine clock group by rearranging the group of second clocks in such a manner that the selected first one of the second clock signals will be positioned as a first-phase clock signal among L-phase clock signals in said L-phase fine clock group, and selecting and outputting a fine timing signal having a delay amount $n \cdot (T2/L)$, where n is a non-negative integer specified by the second selection signal, from the effective edge of the coarse timing signal, based upon the generated L-phase fine clock group.

23. The method according to claim 22, wherein the selected first one of the second clock signals from among the group of second clocks is be the same as the detected second one of the second clock signals from among the group of second clocks.

* * * * *